United States Patent
Takano et al.

(10) Patent No.: US 12,188,153 B2
(45) Date of Patent: Jan. 7, 2025

(54) SINGLE-CRYSTAL PULLING APPARATUS WITH SADDLE-SHAPED SUPERCONDUCTING COILS AND SINGLE-CRYSTAL PULLING METHOD

(71) Applicant: SHIN-ETSU HANDOTAI CO., LTD., Tokyo (JP)

(72) Inventors: Kiyotaka Takano, Annaka (JP); Kosei Sugawara, Nishigo-mura (JP); Hiroyuki Kamada, Nishigo-mura (JP); Takahide Onai, Nishigo-mura (JP); Tomohiko Ohta, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 121 days.

(21) Appl. No.: 17/907,875

(22) PCT Filed: Feb. 22, 2021

(86) PCT No.: PCT/JP2021/006610
§ 371 (c)(1),
(2) Date: Aug. 29, 2022

(87) PCT Pub. No.: WO2021/187017
PCT Pub. Date: Sep. 23, 2021

(65) Prior Publication Data
US 2023/0138632 A1 May 4, 2023

(30) Foreign Application Priority Data

Mar. 17, 2020 (JP) .................................. 2020-046021
Oct. 26, 2020 (JP) .................................. 2020-178960

(51) Int. Cl.
*C30B 15/20* (2006.01)
*C30B 30/04* (2006.01)

(52) U.S. Cl.
CPC .............. *C30B 30/04* (2013.01); *C30B 15/20* (2013.01)

(58) Field of Classification Search
CPC ......... C30B 15/00; C30B 15/20; C30B 15/22; C30B 29/00; C30B 29/02; C30B 29/06; C30B 30/00; C30B 30/04; C30B 35/00
(Continued)

(56) References Cited

U.S. PATENT DOCUMENTS

| 6,019,837 A | 2/2000 | Maeda et al. |
| 2004/0107894 A1 | 6/2004 | Shimonosono et al. |

(Continued)

FOREIGN PATENT DOCUMENTS

| CN | 108026660 A | 5/2018 |
| DE | 10324674 A1 | 1/2004 |

(Continued)

OTHER PUBLICATIONS

Sep. 12, 2023 Notification of Reasons for Refusal issued in Japanese Patent Application No. 2022-508159.
(Continued)

*Primary Examiner* — Kenneth A Bratland, Jr.
(74) *Attorney, Agent, or Firm* — Oliff PLC

(57) ABSTRACT

A single-crystal pulling apparatus including: a pulling furnace having a central axis; and a magnetic field generation device arranged around the pulling furnace and having superconducting coils, the apparatus applying a horizontal magnetic field to the molten semiconductor raw material, two coil axes in the two pairs of the superconducting coils are included in a single horizontal plane, and when a direction of lines of magnetic force at the central axis of the pulling furnace in the horizontal plane is determined as an X axis, a center angle α having the X axis between the two coil axes is 100 degrees or more and 120 degrees or less. This
(Continued)

makes it possible to reduce the height of the coils, to raise the magnetic field center close to the melt surface of the semiconductor raw material, and to obtain a single crystal having a lower oxygen concentration than conventional single crystals.

6 Claims, 13 Drawing Sheets

(58) Field of Classification Search
USPC ....... 117/11, 13, 30, 32, 200, 206, 208, 928, 117/931–932
See application file for complete search history.

(56) References Cited

U.S. PATENT DOCUMENTS

| | | | |
|---|---|---|---|
| 2009/0293801 | A1 | 12/2009 | Kuragaki |
| 2011/0077161 | A1* | 3/2011 | Takami ................. C30B 15/305 335/216 |
| 2018/0237940 | A1* | 8/2018 | Takano ................. C30B 15/14 |

FOREIGN PATENT DOCUMENTS

| | | | |
|---|---|---|---|
| DE | 102009023415 | A1 | 12/2009 |
| JP | S64-037498 | A | 2/1989 |
| JP | 108-333190 | A | 12/1996 |
| JP | H10-291892 | A | 11/1998 |
| JP | H11-176630 | A | 7/1999 |
| JP | 2000-007485 | A | 1/2000 |
| JP | 2001-203106 | A | 7/2001 |
| JP | 2004-051475 | A | 2/2004 |
| JP | 2004189559 | A * | 7/2004 |
| JP | 2007-184383 | A | 7/2007 |
| JP | 2010-006687 | A | 1/2010 |
| JP | 2017-057127 | A | 3/2017 |
| KR | 200327810 | Y1 | 9/2003 |
| KR | 100965499 | B1 | 6/2010 |
| WO | 2005/004174 | A1 | 1/2005 |

OTHER PUBLICATIONS

May 11, 2021 International Search Report issued in International Patent Application No. PCT/JP2021/006610.
Sep. 20, 2022 International Preliminary Report on Patentability issued in International Patent Application No. PCT/JP2021/006610.
May 3, 2024 Office Action issued in German Patent Application No. 11 2021 000 599.5.
May 29, 2024 Office Action issued in Chinese Patent Application No. 202180020036.4.
Oct. 29, 2024 Office Action issued in Korean Patent Application No. 10-2022-7031048.

* cited by examiner

[FIG. 1]
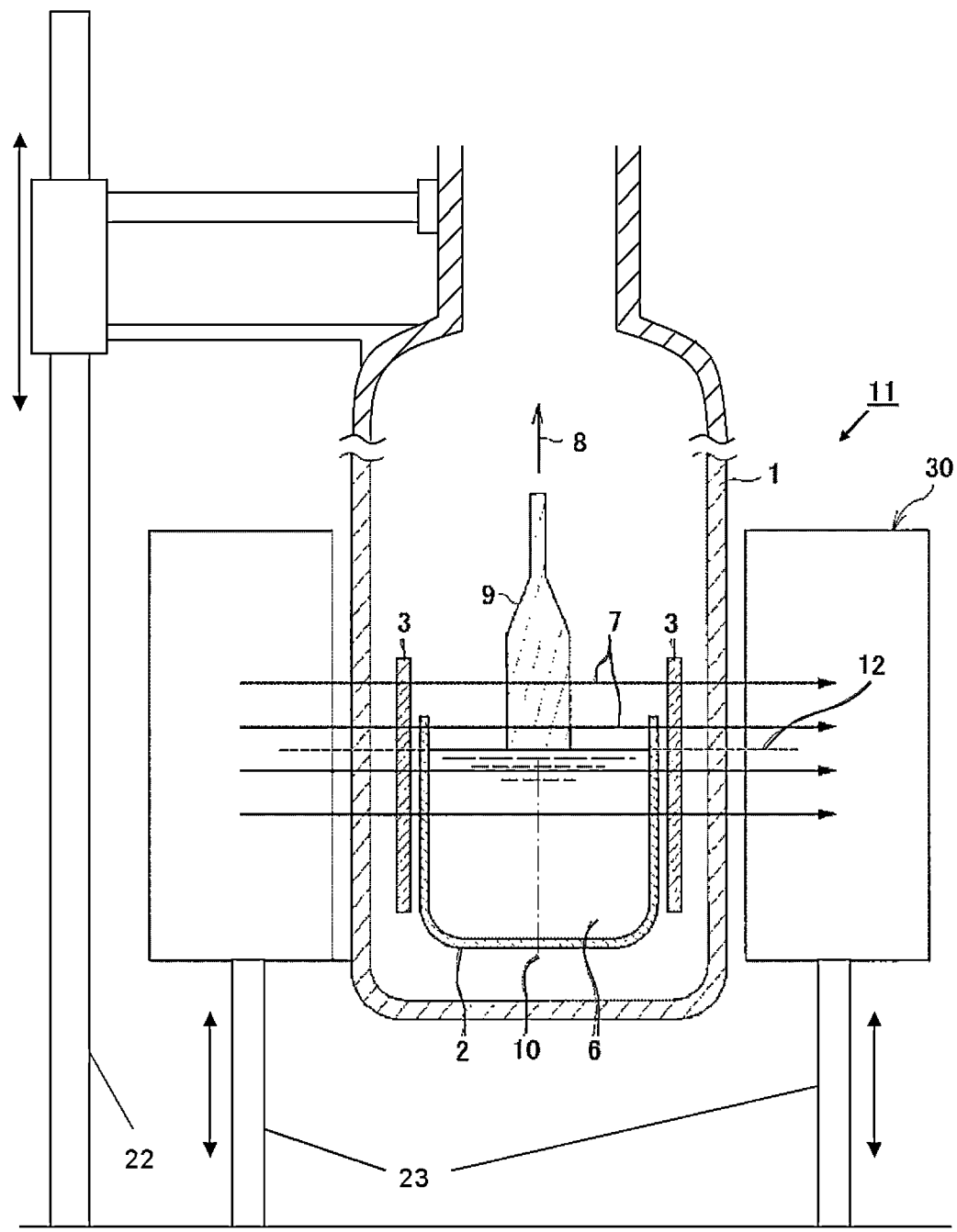

[FIG. 2A]
4
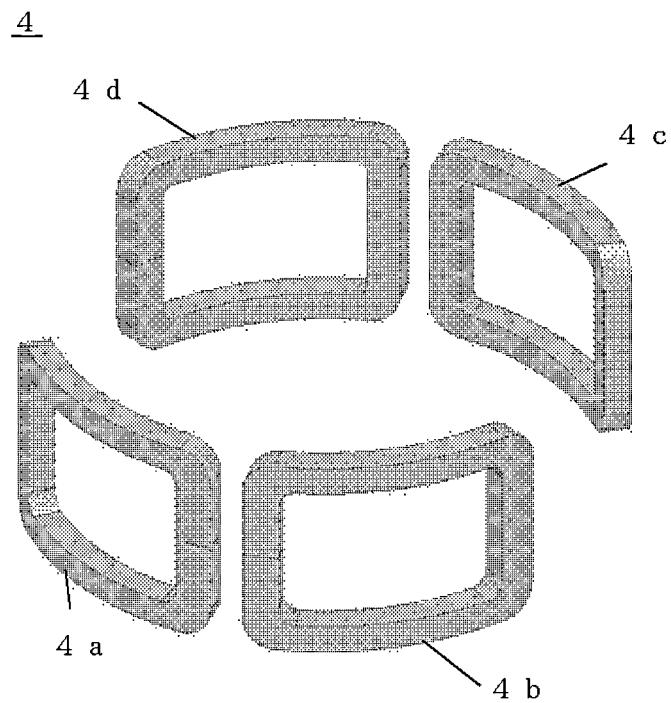
[FIG. 2B]
4
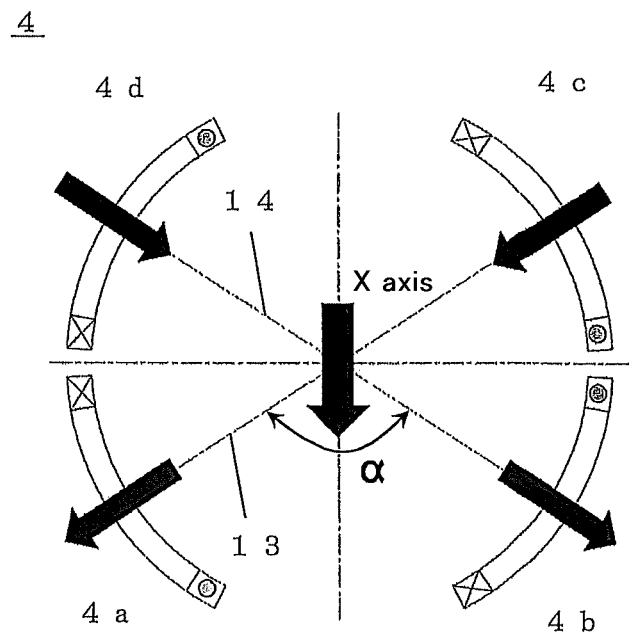

[FIG. 3]
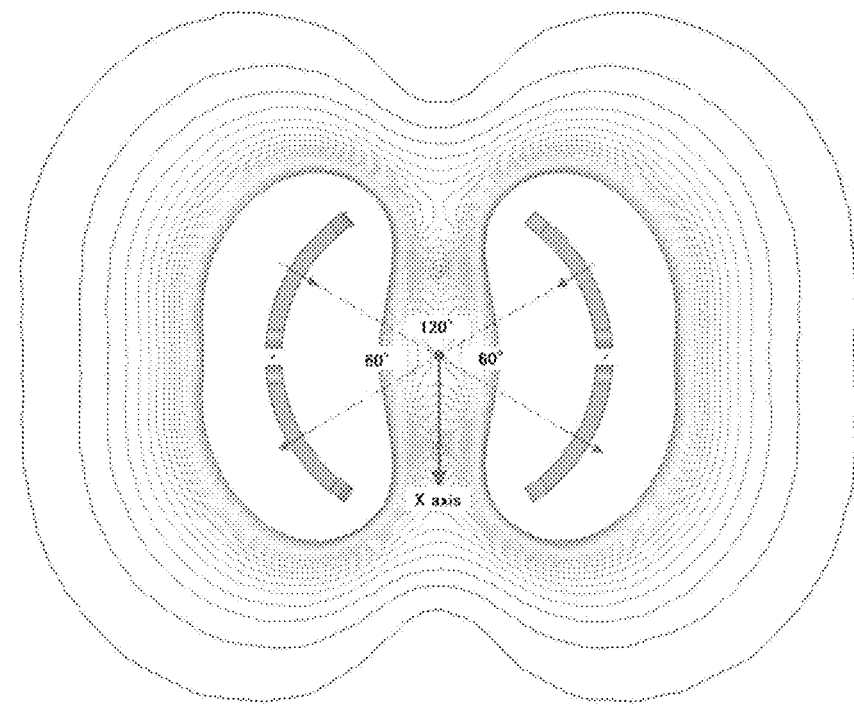
[FIG. 4]
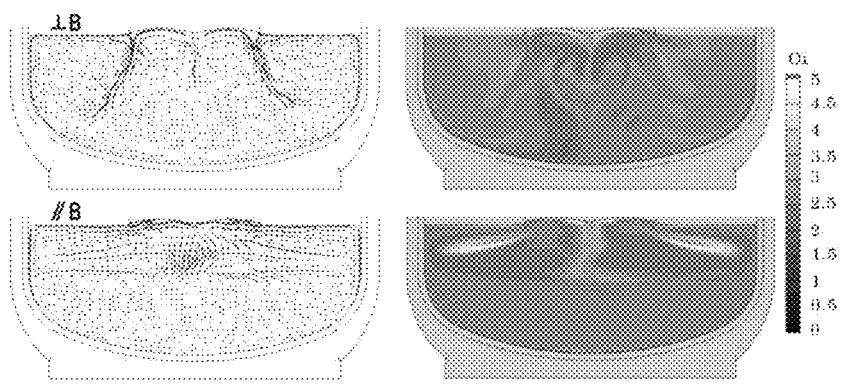
[FIG. 5]
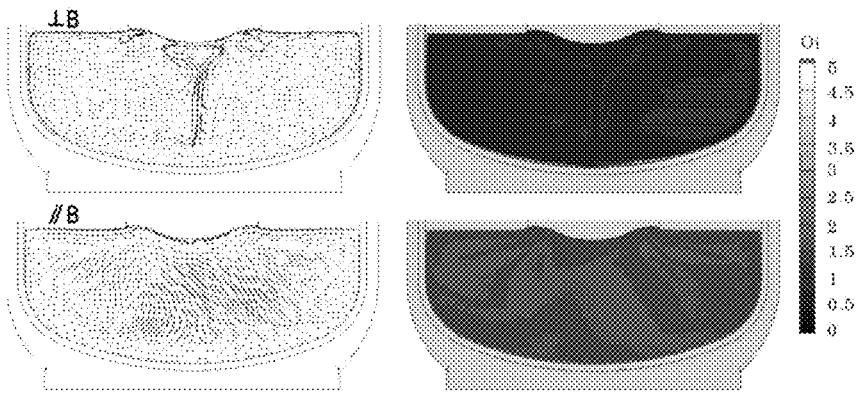

[FIG. 6]
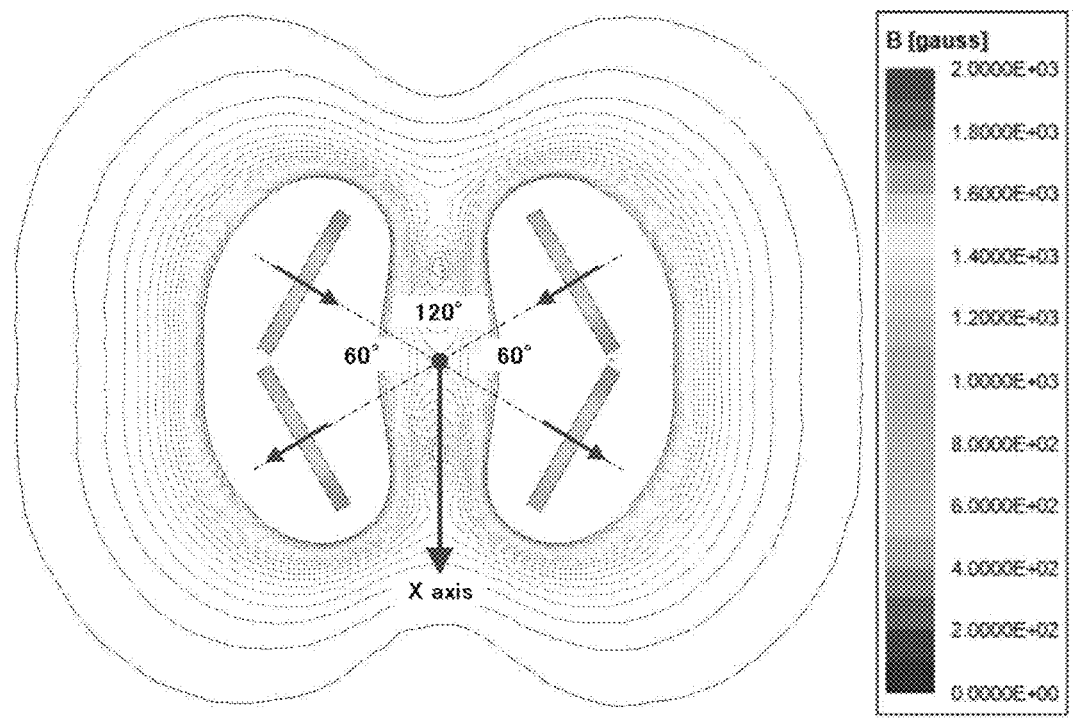
[FIG. 7]
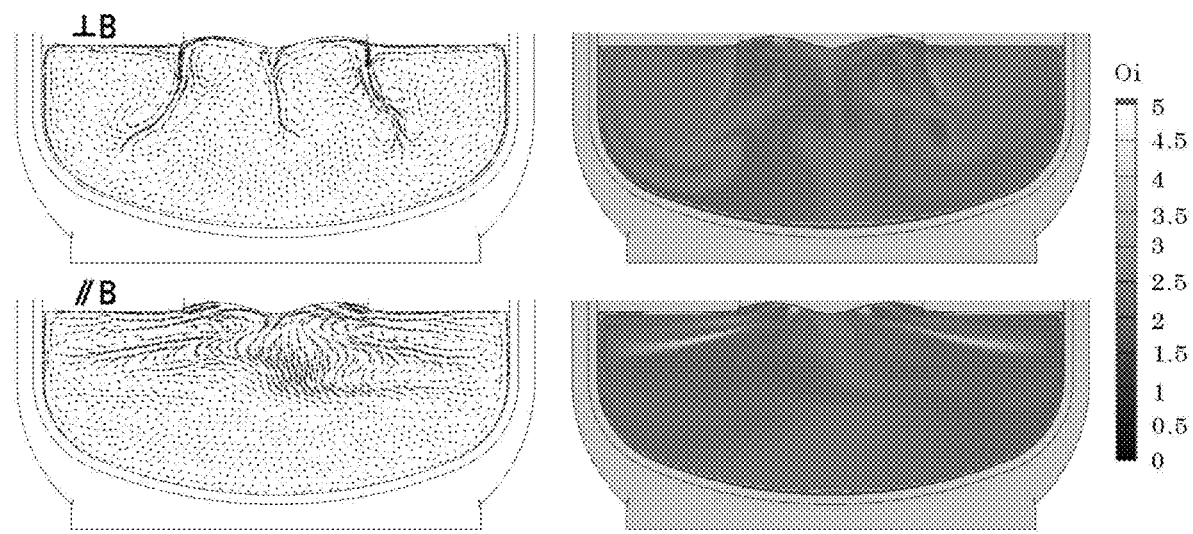

[FIG. 8]
PRIOR ART
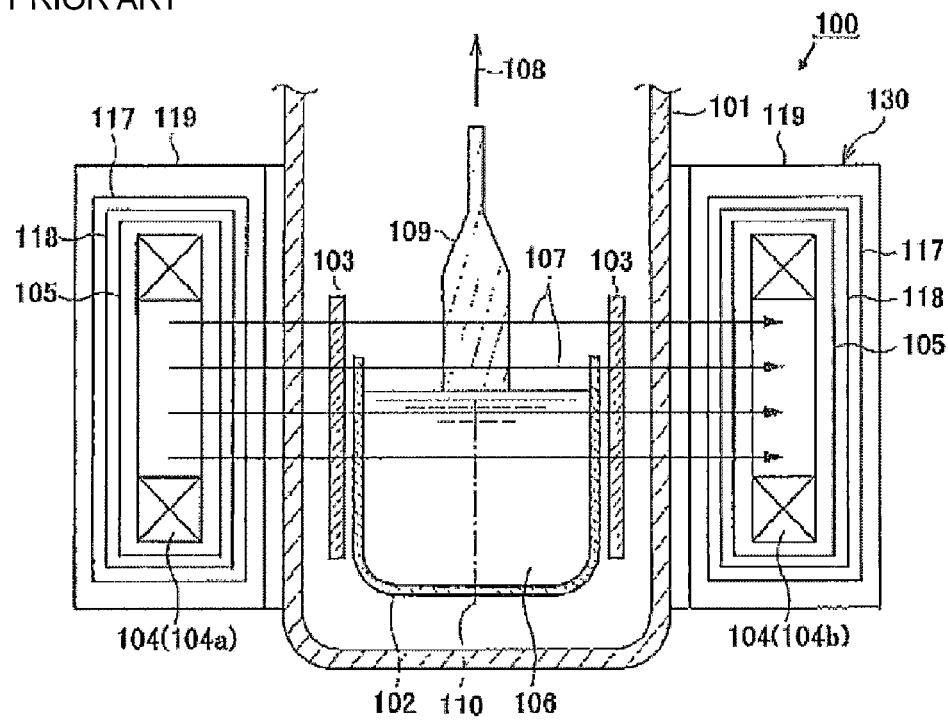
[FIG. 9]
PRIOR ART
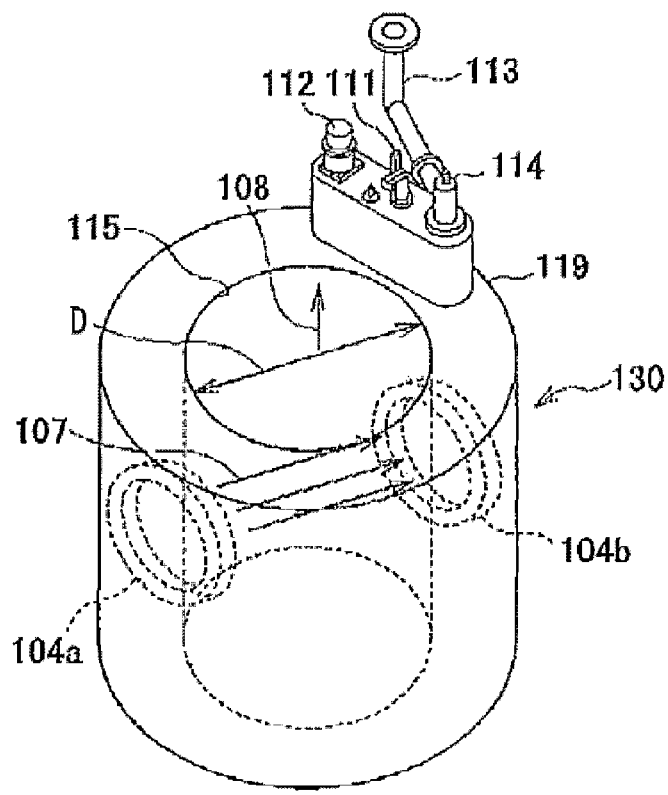

[FIG. 10]
PRIOR ART
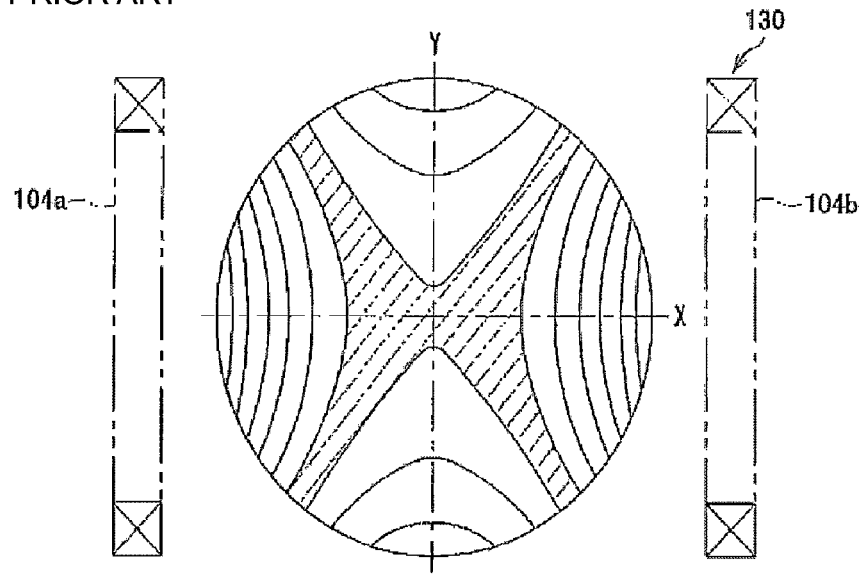
[FIG. 11A]
PRIOR ART
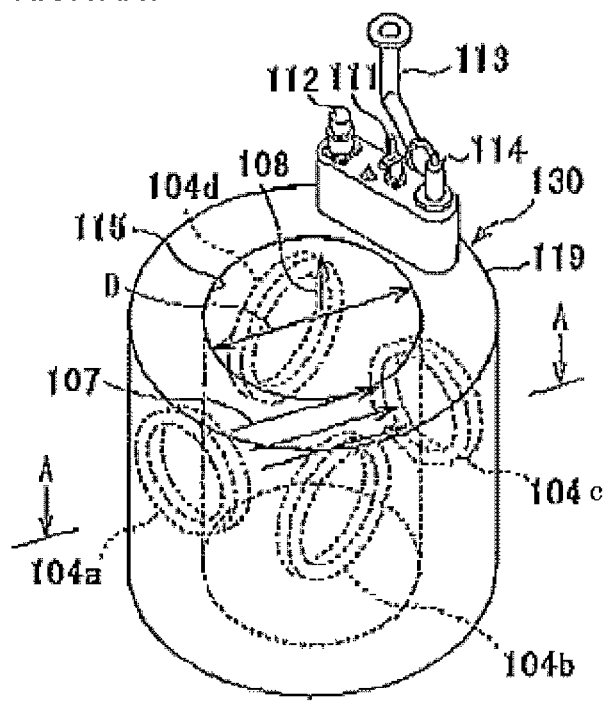

[FIG. 11B]
PRIOR ART
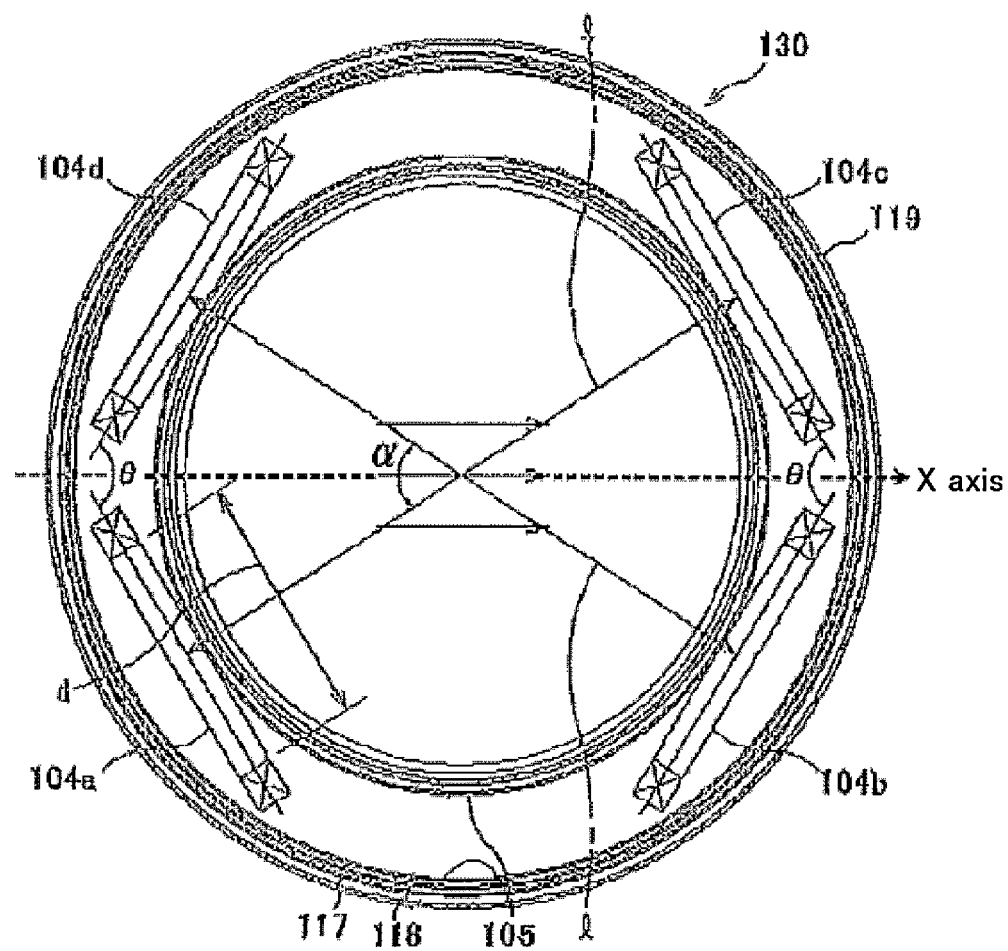

[FIG. 12A]
PRIOR ART
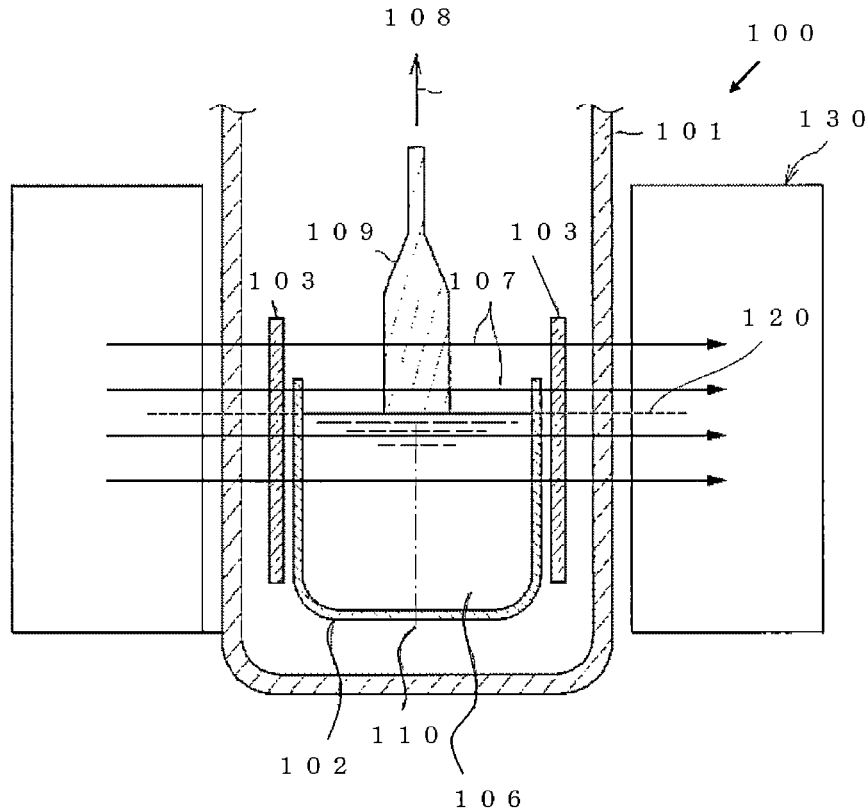
[FIG. 12B]
PRIOR ART
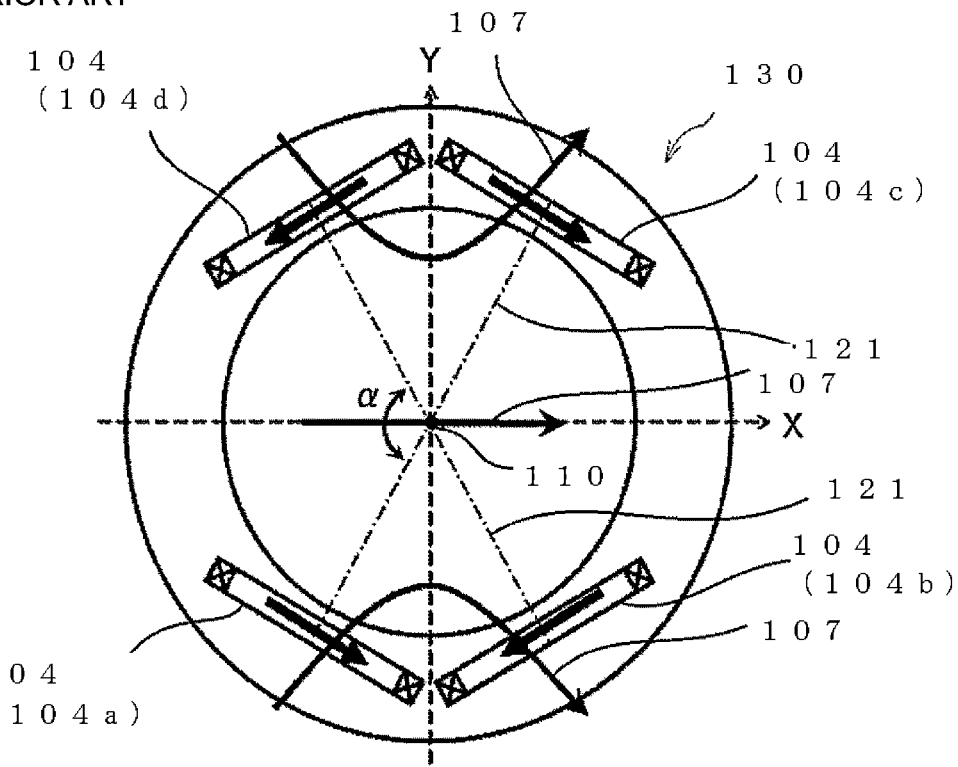

[FIG. 13]
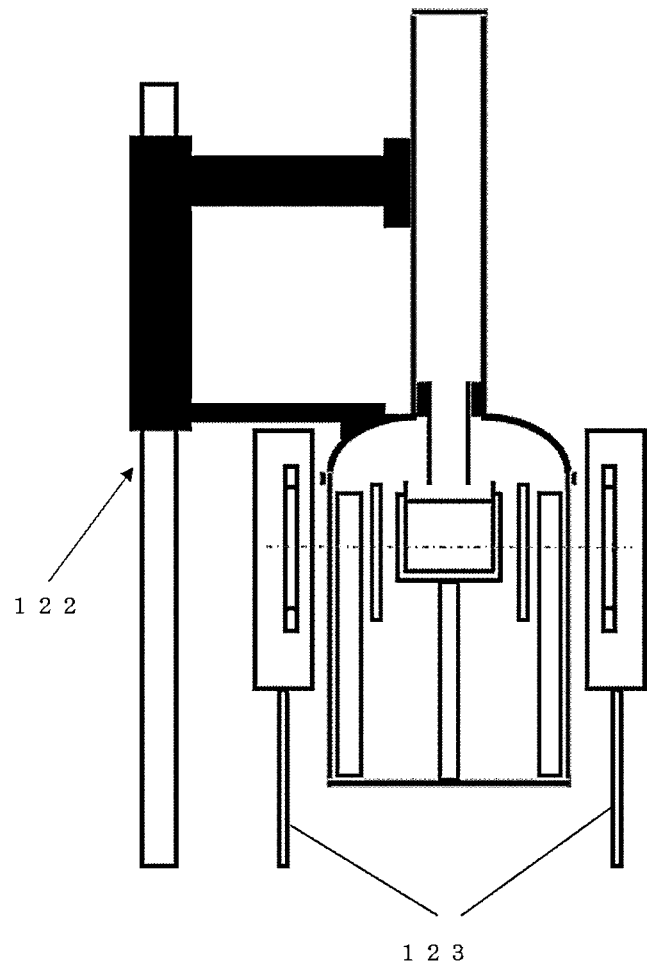
1 2 2
1 2 3
[FIG. 14A]
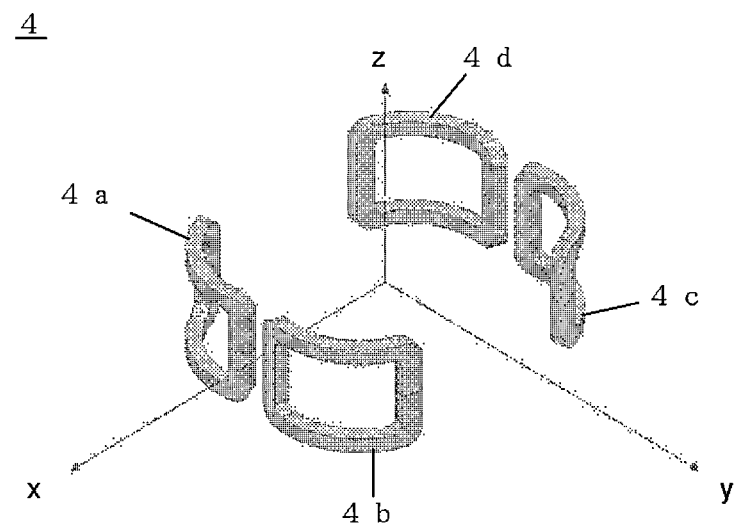

[FIG. 14B]
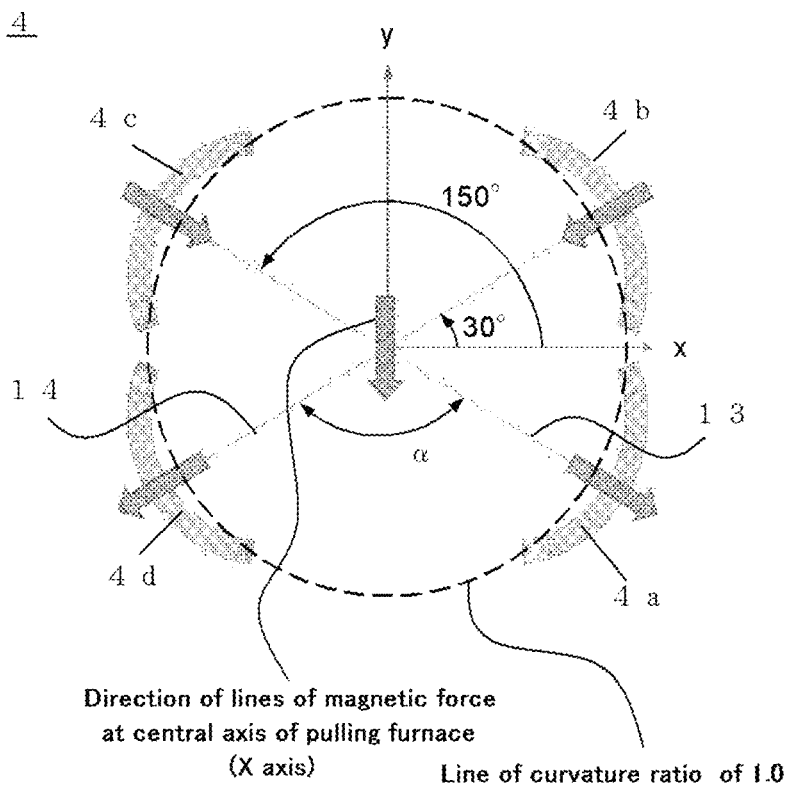
[FIG. 15]
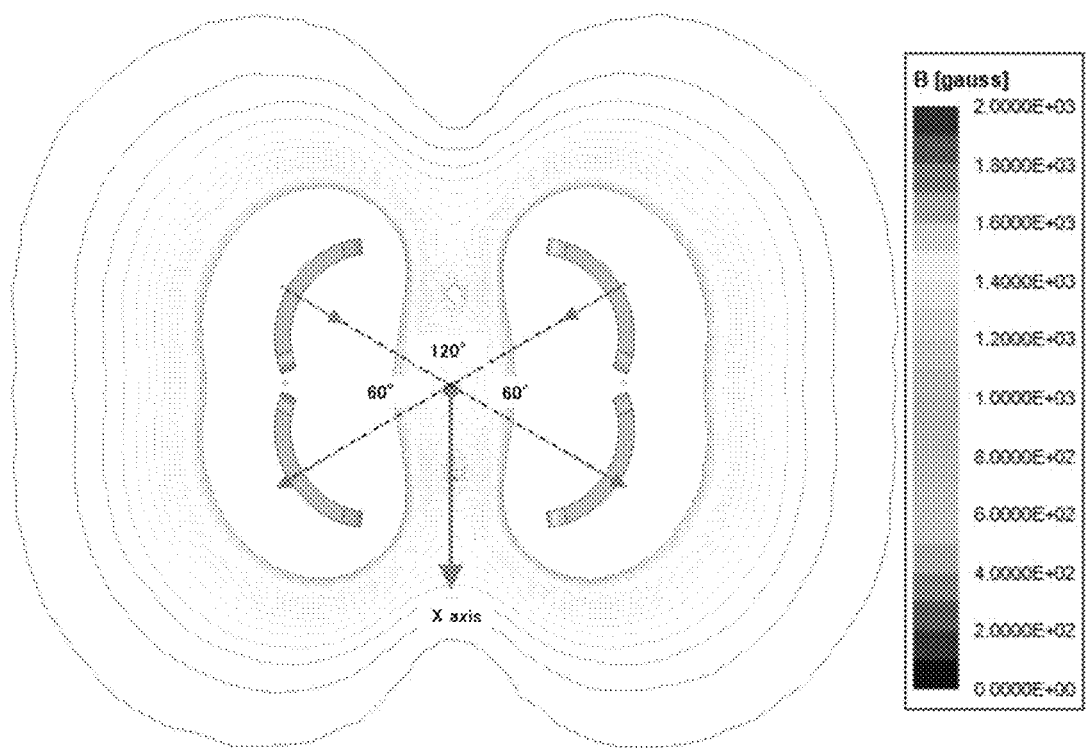

[FIG. 16]
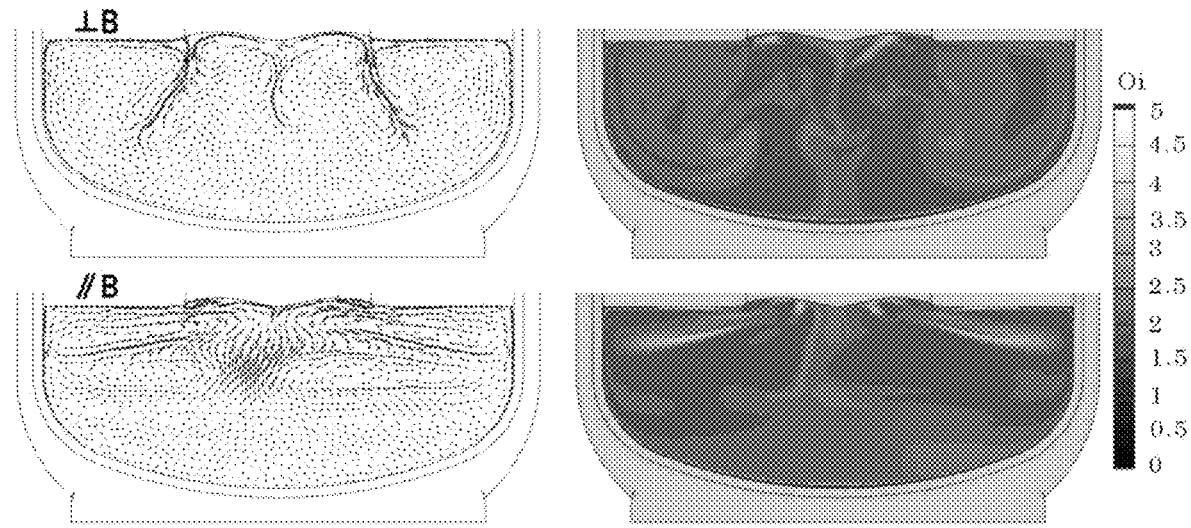
[FIG. 17]
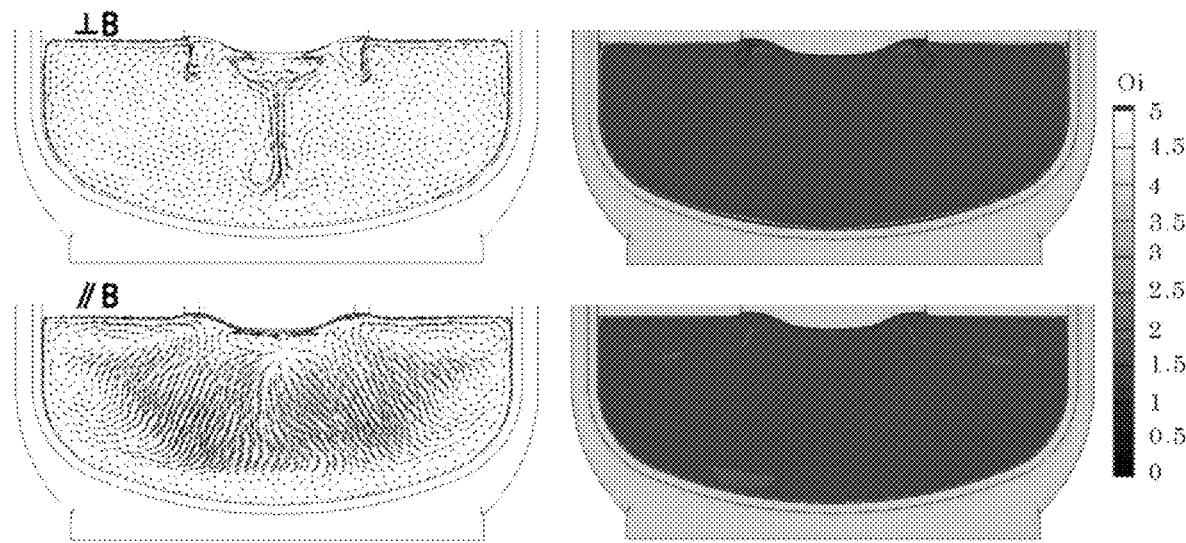

[FIG. 18]
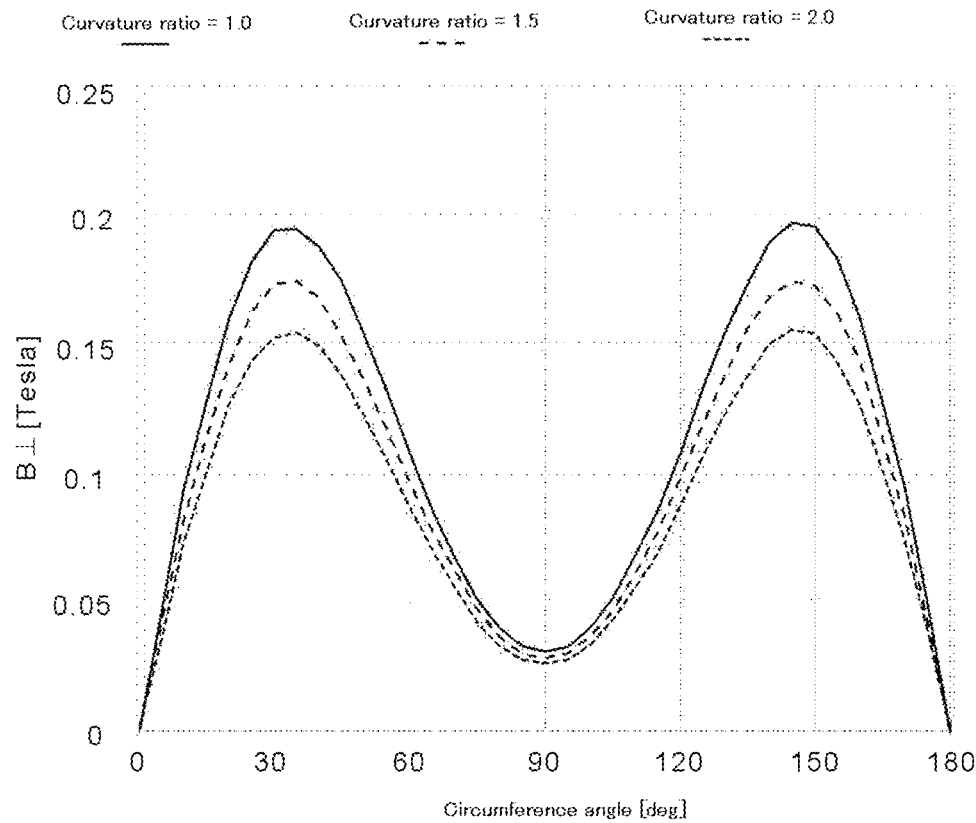
[FIG. 19]
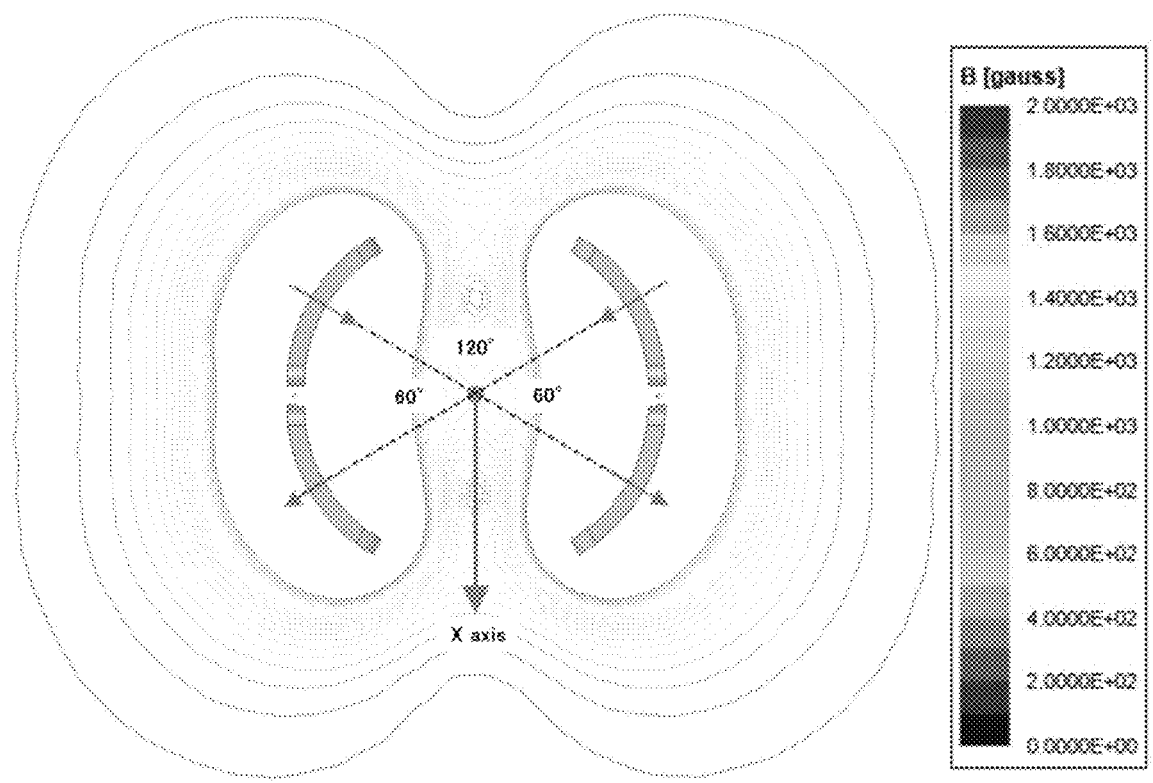

[FIG. 20]
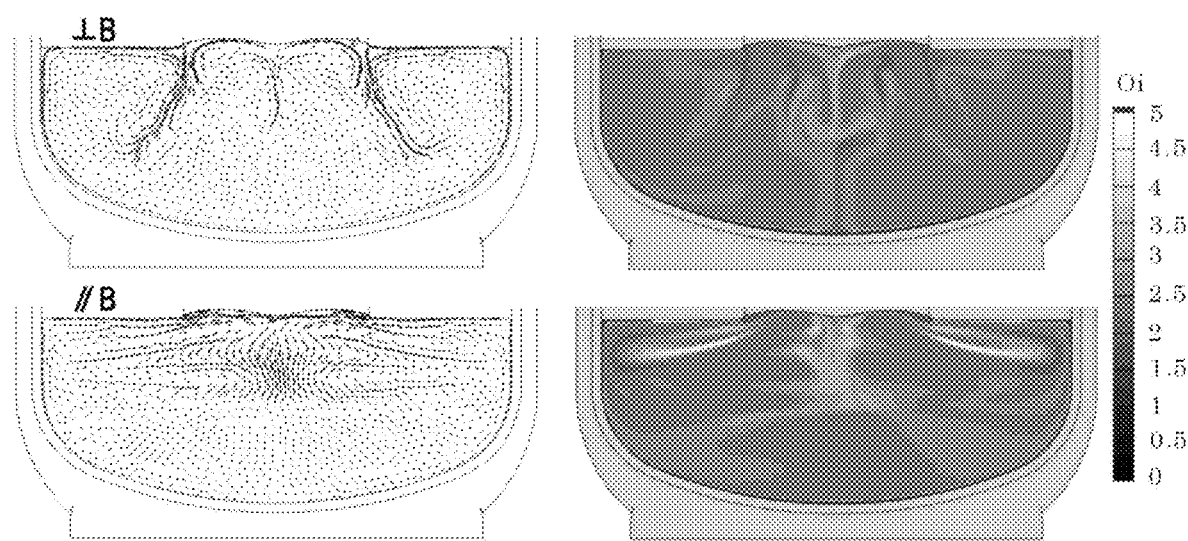

SINGLE-CRYSTAL PULLING APPARATUS WITH SADDLE-SHAPED SUPERCONDUCTING COILS AND SINGLE-CRYSTAL PULLING METHOD

TECHNICAL FIELD

The present invention relates to: a single-crystal pulling apparatus; and a single-crystal pulling method using the same.

BACKGROUND ART

Each of semiconductors such as silicon or gallium arsenide is constituted of a single crystal and is used for memories and the like of small to large computers, and an increase in capacity, a reduction in cost, and improvement in quality of memory devices have been demanded.

As one of single-crystal pulling methods for manufacturing single crystals which meet these demands of the semiconductors, there has been conventionally known a method for manufacturing a semiconductor having a large diameter and high quality by applying a magnetic field to a molten semiconductor raw material contained in a crucible and thereby inhibiting heat convection produced in a melt (which is generally referred to as a magnetic field applied Czochralski (MCZ) method).

An example of a single-crystal pulling apparatus using the conventional CZ method will be described with reference to FIG. 8.

This single-crystal pulling apparatus 100 includes a pulling furnace 101 having an open top, and includes a crucible 102 in this pulling furnace 101. Further, a heater 103 for heating and melting a semiconductor raw material 106 in the crucible 102 is provided around the crucible 102 in the pulling furnace 101, and a superconducting magnet 130 having a pair of (two) superconducting coils 104 (104a and 104b) incorporated in a refrigerant container 105 as a cylindrical container (which will also be referred to as a cylindrical refrigerant container hereinafter) is arranged on an outer side of the pulling furnace 101.

At the time of manufacturing single crystals, a semiconductor raw material 106 is put in the crucible 102 and heated by the heater 103 to melt the semiconductor raw material 106. A non-illustrated seed crystal is moved down and brought into contact with this melt from above, e.g., a central portion of the crucible 102, and the seed crystal is pulled in a pulling direction 108 at a predetermined velocity by a non-illustrated pulling mechanism. Consequently, a crystal grows in a solid and liquid boundary layer, and a single crystal is produced. At this time, when fluid motion of the melt induced by heating of the heater 103, i.e., the heat convection is produced, a dislocation of the single crystal to be pulled is apt to occur, and a yield rate of single-crystal production is lowered.

Thus, as a countermeasure, the superconducting coils 104 of the superconducting magnet 130 are used. That is, the semiconductor raw material 106, which is the melt, receives motion-suppressing power by lines of magnetic force 107 produced by energization to the superconducting coils 104, is slowly pulled upward with pulling of the seed crystal without producing the convection in the crucible 102, and the single crystal is manufactured as a solid single crystal 109. Note that, although not shown, the pulling mechanism for pulling the single crystal 109 along a crucible central line (central axis 110 of the pulling furnace 101) is provided above the pulling furnace 101.

Next, an example of the superconducting magnet 130 used in the single-crystal pulling apparatus 100 shown in FIG. 8 will be described with reference to FIG. 9.

This superconducting magnet 130 has the superconducting coils 104 (104a and 104b) contained in a cylindrical vacuum container 119 through the cylindrical refrigerant container. In this superconducting magnet 130, the pair of superconducting coils 104a and 104b facing each other through a central portion of the cylindrical vacuum container 119 are accommodated. The pair of superconducting coils 104a and 104b are Helmholtz-type magnetic coils which generate magnetic fields parallel to the same lateral direction, and, as shown in FIG. 8, the lines of magnetic force 107 are generated bisymmetrically to the central axis 110 of the pulling furnace 101 and the cylindrical vacuum container 119 (a position of this central axis 110 is referred to as a magnetic field center).

Note that, as shown in FIGS. 8 and 9, this superconducting magnet 130 includes a current lead 111 through which a current is introduced to the two superconducting coils 104a and 104b, a small helium refrigerator 112 for cooling a first radiation shield 117 and a second radiation shield 118 contained in the cylindrical vacuum container 119, a gas discharge pipe 113 through which a helium gas in the cylindrical refrigerant container 105 is discharged, a service port 114 having a replenishing port from which a liquid helium is replenished, and others. The pulling furnace 101 shown in FIG. 8 is arranged in a bore 115 (the inner diameter of the bore is represented by D) of such a superconducting magnet 130.

FIG. 10 shows a magnetic field distribution of the above-described conventional superconducting magnet 130.

As shown in this FIG. 10, in the conventional superconducting magnet 130, a magnetic field gradually increases toward both sides in each coil-arranging direction (an X direction in FIG. 10), and the magnetic field gradually decreases toward an up-and-down direction in a direction orthogonal to the former (a Y direction in FIG. 10) since the pair of superconducting coils 104a and 104b facing each other are arranged. In such a conventional configuration, since a magnetic field gradient in the range of the bore 115 is too large as shown in FIGS. 9 and 10, suppression of the heat convection produced in the melt is unbalanced, and magnetic field efficiency is poor. That is, as indicated by hatched lines in FIG. 10, magnetic field uniformity is not good in a region near a magnetic field center (i.e., a cross shape which is elongated from right to left and up and down is formed in FIG. 10), and hence there arises a problem that a heat convection suppressing precision is poor and a high-quality single crystal cannot be pulled.

A technique for solving the above-described problem is disclosed in Patent Document 1. The technique disclosed in Patent Document 1 will be described with reference to FIGS. 11A and 11B.

FIGS. 11A and 11B show a different example of a superconducting magnet. FIG. 11A is a perspective view, and FIG. 11B shows an A-A transverse cross section of FIG. 11A. To solve the problem, as shown in FIG. 11A and FIG. 11B, Patent Document 1 discloses that the number of superconducting coils 104 is four or more (e.g., 104a, 104b, 104c, and 104d), the centers of the superconducting coils 104 are arranged on a plane in a cylindrical vacuum container 119 concentrically provided around a pulling furnace, the respective arranged superconducting coils 104 are set to directions in which they face each other through an axial center of the cylindrical vacuum container 119, and an arrangement angle θ (see FIG. 11B) at which each pair of superconducting coils adjacent to each other face the inner side of the cylindrical vacuum container 119 is set to a range of 100° to 130° (i.e., a center angle α (see FIG. 11B) between axes of coils adjacent to each other with the X axis at the center is 50° to 80°).

Consequently, a lateral magnetic field which has a reduced magnetic field gradient and excellent uniformity can be generated in a bore 115, a magnetic field distribution having a concentric shape or a square shape can be produced on a plane, and unbalanced electromagnetic force can be greatly suppressed. Thus, a uniform magnetic field region in the pulling direction can be improved, a magnetic field in the lateral magnetic field direction becomes substantially horizontal, manufacture of a high-quality single crystal can be realized by suppression of the unbalanced electromagnetic force, and this Patent Document also discloses that a high-quality single crystal can be pulled with a good yield rate by this single-crystal pulling method. Note that in FIG. 11B, the reference sign "d" is the diameter (inner diameter) of the superconducting coils, and the reference sign "l" is the distance between the pair of coils.

According to this method, the distribution of the magnetic field applied to the molten semiconductor raw material is made uniform, and unbalanced electromagnetic force is suppressed, so that it has become possible to suppress heat convection even with a magnetic flux density lower than that of the conventional technique using two coils.

However, it has been revealed from comprehensive heat transfer analysis including three-dimensional melt convection that there is a difference in heat convection between a cross section parallel to the X axis and a cross section parallel to the Y axis when the lines of magnetic force form a lateral magnetic field that extends in the X axis direction, even in such a uniform magnetic field distribution (see Patent Document 2).

In a case where a conducting fluid moves in a magnetic field, an induced current is produced in a direction orthogonal to lines of magnetic force and a velocity component perpendicular to the lines of magnetic force, but a crucible wall and a free surface of the molten semiconductor raw material become an insulating wall when a quartz crucible having electrically insulating properties is used. Hence, the induced current does not flow in the direction orthogonal to these members. Thus, convection-suppressing force provided by electromagnetic force is weak in an upper portion of the molten semiconductor raw material. In addition, comparing the cross section parallel to the X axis (the cross section parallel to the lines of magnetic force) with the cross section perpendicular to the X axis (the cross section perpendicular to the lines of magnetic force), the convection is stronger in the cross section perpendicular to the X axis (the cross section perpendicular to the lines of magnetic force).

As described, when a uniform magnetic field distribution is formed by the four coils, the difference in velocity of the convection is slightly smaller, but there is still a non-uniform flow velocity distribution in a circumferential direction. In particular, since the flow field connecting the crucible wall to a growth interface remains in the cross section perpendicular to the lines of magnetic force, oxygen eluted from the quartz crucible reaches the crystal. Hence, an oxygen concentration-reducing effect provided by application of a magnetic field has a limit, and a need for extremely low oxygen concentration in semiconductor crystals for power devices or image sensors and so forth which have high demand recently is hard to be met. Furthermore, presence of the flow field which is non-uniform in the circumferential direction can cause growth striations in the crystal which is pulled while rotating the same, and a resistivity/oxygen concentration fluctuation in a crystal rotation period is observed when the cross section parallel to a growth direction is evaluated, and hence a ring-shaped distribution is formed in a wafer plane sliced in a direction perpendicular to the growth direction.

To solve this problem, Patent Document 2 discloses a single-crystal pulling apparatus such as the one shown in FIGS. 12A and 12B. FIG. 12A is a schematic view of the apparatus, and FIG. 12B shows a transverse cross section showing an example of a superconducting magnet.

A magnetic field distribution is generated in such a manner that a magnetic flux density distribution on an X axis is a distribution which is convex upward when a direction of lines of magnetic force 107 at the central axis 110 of a pulling furnace in a horizontal plane 120 including two coil axes 121 passing through the centers of the pairs (104a and 104c, 104b and 104d) of the superconducting coils 104 is determined as the X axis, and that a magnetic flux density on the X axis becomes 80% or less of a magnetic flux density set value at a crucible wall, at the same time that a magnetic flux density distribution on a Y axis which is orthogonal to the X axis and runs through the central axis 110 in the horizontal plane 120 is a distribution which is convex downward, and a magnetic flux density on the Y axis becomes 140% or more of the magnetic flux density set value at the crucible wall when the magnetic flux density at the central axis 110 in the horizontal plane 120 is determined as the magnetic flux density set value. In addition, in the magnetic field generation device, two pairs of superconducting coils 104 (104a and 104c, 104b and 104d) arranged to face each other are provided in such a manner that respective coil axes 121 thereof are included in the same horizontal plane 120, and a center angle α having the X axis sandwiched between the two coil axes 121 is set to 100 degrees or more and 120 degrees or less.

In this manner, the technology disclosed in Patent Document 2 can achieve the following effects. That is, a flow velocity of the molten semiconductor raw material can be reduced even in the cross section perpendicular to the X axis which has insufficient convection-suppressing force provided by electromagnetic force, and a flow velocity of the molten semiconductor raw material in the cross section parallel to the X axis can be balanced with a flow velocity of the molten semiconductor raw material in the cross section perpendicular to the X axis.

In addition, when the flow velocity of the molten semiconductor raw material is reduced even in the cross section perpendicular to the X axis, a time required for oxygen eluted from a crucible wall to reach the single crystal is prolonged, and it is possible to provide the single-crystal pulling apparatus which can greatly reduce oxygen concentration which is taken into the single crystal, by increasing an oxygen evaporation amount from a free surface of the molten semiconductor raw material. Furthermore, it is stated that it is possible to provide the single-crystal pulling apparatus which can suppress the growth striations in the single crystal to be grown by balancing the flow velocity of the molten semiconductor raw material in the cross section parallel to the X axis with the flow velocity of the molten semiconductor raw material in the cross section perpendicular to the X axis.

CITATION LIST

Patent Literature

Patent Document 1: JP 2004-51475 A
Patent Document 2: JP 2017-57127 A
Patent Document 3: JP H10-291892 A

SUMMARY OF INVENTION

Technical Problem

However, the present inventors have analyzed the magnetic field distribution with various coil arrangements, and as a result, it has been revealed that the magnetic field distribution disclosed in Patent Document 2 can also be realized with coil arrangements other than those disclosed in Patent Document 2.

In addition, in order to raise magnetic field efficiency by the coil arrangements, the coil diameter needs to be as large as possible, and accordingly, the container containing the coils also needs a certain height. In the case of a magnet device in a cylindrical container (also referred to as a magnetic field generation device or a superconducting magnet), dismantling and setting up are necessary at a stage when the pulling of the crystal is finished, and at this time, the magnet device needs to be lowered/raised. Therefore, the magnet device needs to be mounted on an apparatus for raising and lowering.

Regarding the positional relationship between the magnet and the molten raw material, it is known, as also described in Patent Document 3, that when the height of the magnetic field center of a lateral magnetic field is raised close to the melt surface of the molten raw material, the oxygen concentration in the crystal decreases, and that when the height is lowered to a position deep in the melt, the oxygen concentration is raised. The upper limit position of this magnet device is determined on the basis of interference between the stroke of the apparatus for raising and lowering and the pulling furnace side, but generally, the chamber of the pulling furnace is connected with a hydraulic cylinder and an arm on the outside of the magnet device to enable raising, lowering, and revolution. FIG. 13 shows an example of an apparatus 122 for raising and lowering a pulling furnace and an apparatus 123 for raising and lowering a superconducting magnet. Thus, this determines the upper limit position of the magnet device. The greater the overall height of the magnet device, the less it is possible to raise the magnetic field center position, which is the center in the direction of the coil height, upward. Therefore, this is disadvantageous for obtaining a low-oxygen crystal.

The present invention has been made in view of the problems, and an object thereof is to provide a single-crystal pulling apparatus and a single-crystal pulling method that make it possible to reduce the height of the coils by raising magnetic field generation efficiency, to raise the magnetic field center close to the melt surface of the semiconductor raw material, and to obtain a single crystal having an even lower oxygen concentration than conventional single crystals.

Solution to Problem

To achieve the object, the present invention provides a single-crystal pulling apparatus comprising: a pulling furnace which has a heater and a crucible containing a molten semiconductor raw material arranged therein, and which has a central axis; and a magnetic field generation device which is arranged around the pulling furnace and has superconducting coils, the single-crystal pulling apparatus applying a horizontal magnetic field to the molten semiconductor raw material by energization to the superconducting coils to suppress convection of the molten semiconductor raw material in the crucible, wherein the superconducting coils of the magnetic field generation device are saddle-shaped and are curved along an outer shape of the pulling furnace, two pairs of the saddle-shaped superconducting coils being arranged around the pulling furnace to face each other, when axes running through centers of the pairs of the superconducting coils arranged to face each other are determined as coil axes, the two coil axes in the two pairs of the superconducting coils are included in a single horizontal plane, and when a direction of lines of magnetic force at the central axis of the pulling furnace in the horizontal plane is determined as an X axis, a center angle $\alpha$ having the X axis sandwiched between the two coil axes is 100 degrees or more and 120 degrees or less.

When the center angle $\alpha$ having the X axis sandwiched between the two coil axes is 100 degrees or more and 120 degrees or less, the component of the lines of magnetic force orthogonal to the crucible is strong near a cross section perpendicular to the X axis. Therefore, natural convection is easily suppressed even in the vicinity of a cross section perpendicular to the X axis, and it is possible to balance the convection with the flow velocity in a cross section parallel to the X axis. When the flow velocity of the molten semiconductor raw material is reduced even in the cross section perpendicular to the X axis, a time required for the oxygen eluted from a crucible wall to reach the single crystal is prolonged, and the amount of oxygen evaporated from the free surface of the molten semiconductor raw material increases. Thus, it is possible to achieve a single-crystal pulling apparatus that makes it possible to reduce the concentration of the oxygen taken into the single crystal considerably.

Furthermore, it is possible to provide the single-crystal pulling apparatus which can suppress the growth striations in the single crystal to be grown by balancing the flow velocity of the molten semiconductor raw material in the cross section parallel to the X axis with the flow velocity in the cross section perpendicular to the X axis.

In addition, adjacent superconducting coils can be arranged appropriately without coming too close to one another and colliding.

Furthermore, when the superconducting coils are saddle-shaped coils rather than conventional circular coils, the perimeter of the coils can be lengthened, so that it is possible to generate a magnetic field having a greater magnetic flux density at the same current value. That is, magnetic field generation efficiency can be enhanced.

Moreover, since the coils are saddle-shaped, the overall height of the coils is smaller than circular coils, so that the height position of the centers of the coils in the magnetic field generation device can be raised. Therefore, when raised to the upper limit with an apparatus for raising and lowering, the magnetic field center can be set to a higher position relative to the melt. Hence, it is possible to obtain a single crystal having an even lower oxygen concentration than a conventional single-crystal pulling apparatus, for example, as in Patent Document 2.

In addition, to achieve the above-described object, the present invention provides a single-crystal pulling apparatus comprising: a pulling furnace which has a heater and a crucible containing a molten semiconductor raw material arranged therein, and which has a central axis; and a magnetic field generation device which is arranged around the pulling furnace and has superconducting coils, the single-crystal pulling apparatus applying a horizontal magnetic field to the molten semiconductor raw material by energization to the superconducting coils to suppress convection of the molten semiconductor raw material in the crucible, wherein the superconducting coils of the magnetic field generation device are saddle-shaped and are curved by a curvature larger than a curvature of a shape along an outer shape of the pulling furnace, two pairs of the saddle-shaped superconducting coils being arranged around the pulling furnace to face each other, when axes running through centers of the pairs of the superconducting coils arranged to face each other are determined as coil axes, the two coil axes in the two pairs of the superconducting coils are included in a single horizontal plane, and when a direction of lines of magnetic force at the central axis of the pulling furnace in the horizontal plane is determined as an X axis, a center angle $\alpha$ having the X axis sandwiched between the two coil axes is 100 degrees or more and 120 degrees or less.

When the center angle $\alpha$ having the X axis sandwiched between the two coil axes is 100 degrees or more and 120 degrees or less, the component of the lines of magnetic force orthogonal to the crucible is strong near a cross section perpendicular to the X axis. Therefore, natural convection is easily suppressed even in the vicinity of a cross section perpendicular to the X axis, and it is possible to balance the convection with the flow velocity in a cross section parallel to the X axis. When the flow velocity of the molten semiconductor raw material is reduced even in the cross section perpendicular to the X axis, a time required for the oxygen eluted from a crucible wall to reach the single crystal is prolonged, and the amount of oxygen evaporated from the free surface of the molten semiconductor raw material increases. Thus, it is possible to achieve a single-crystal pulling apparatus that makes it possible to reduce the concentration of the oxygen taken into the single crystal considerably.

Furthermore, it is possible to provide the single-crystal pulling apparatus which can suppress the growth striations in the single crystal to be grown by balancing the flow velocity of the molten semiconductor raw material in the cross section parallel to the X axis with the flow velocity in the cross section perpendicular to the X axis.

In addition, adjacent superconducting coils can be arranged appropriately without coming too close to one another and colliding.

Furthermore, when the superconducting coils are saddle-shaped coils rather than conventional circular coils, the perimeter of the coils can be lengthened, so that it is possible to generate a magnetic field having a greater magnetic flux density at the same current value. That is, magnetic field generation efficiency can be enhanced.

Moreover, since the coils are saddle-shaped, the overall height of the coils is smaller than circular coils, so that the height position of the centers of the coils (the height position of the coil axes) in the magnetic field generation device can be raised. Therefore, when raised to the upper limit with an apparatus for raising and lowering, the magnetic field center can be set to a higher position relative to the melt. Hence, it is possible to obtain a single crystal having an even lower oxygen concentration than a conventional single-crystal pulling apparatus, for example, as in Patent Document 2.

In addition, in a plane view, in a region of an angle (coil axis angle region) that corresponds to (or is close to) the center region of the pairs of the superconducting coils (that is, near the positions of the coil axes), a component of the magnetic flux density orthogonal to the crucible is stronger than in regions of other angles and a diffusion boundary layer of oxygen in the melt near the inner wall of the crucible is thin, so that oxygen easily dissolves from the crucible. However, in the present invention, making use of the fact that the magnetic flux density at a distance from the coils is inversely proportional to the square of the distance to the coils, the saddle shape of the superconducting coils is curved by a curvature larger than the curvature of the shape along the outer shape of the pulling furnace. Therefore, the magnetic flux density in the coil axis angle region can be reduced, so that dissolution of oxygen from the crucible in the angle region can be suppressed. As a result, it is possible to obtain a single crystal having an even lower oxygen concentration.

In this event, a ratio of the curvature of the saddle-shaped superconducting coils to the curvature of the shape along the outer shape of the pulling furnace can be 1.2 or more and 2.0 or less.

When this ratio (also referred to as curvature ratio) is 1.2 or more, decrease in the magnetic flux density and the suppression of the dissolution of oxygen can be achieved more effectively. Meanwhile, when the ratio is 2.0 or less, the outer shape of the casing for storing the coils can be prevented from becoming too large, and in addition, degradation in maximum magnetic field strength can be prevented from being caused by degradation in central magnetic field strength.

In this event, the magnetic field generation device can be mounted on an apparatus for raising and lowering that is vertically movable in a vertical direction.

In this way, the magnetic field generation device can be lowered when dismantling and setting up after an operation has been finished, and an operator can dismantle and clean a hot zone inside the furnace easily. Furthermore, in pulling of a single crystal, the height position of the magnetic field generation device can be more easily adjusted so that the oxygen concentration in the single crystal is a desired value.

Furthermore, the saddle-shaped superconducting coils can have a height that is shorter than a width of the saddle-shaped superconducting coils.

In such a single-crystal pulling apparatus, the overall height of the coils can be shortened more certainly, so that the height position of the coil center can be raised and the magnetic field center can be set in a higher position. Thus, a single crystal having a low concentration of oxygen can be obtained more easily.

In addition, the present invention provides a single-crystal pulling method comprising pulling a semiconductor single crystal by using the above-described single-crystal pulling apparatus.

According to such a single-crystal pulling method, the concentration of oxygen that is taken in is greatly reduced, and a semiconductor single crystal with suppressed growth striations can be grown.

In this event, a height position of the magnetic field generation device can be adjusted in accordance with a target value of a concentration of oxygen contained in the semiconductor single crystal when pulling the semiconductor single crystal.

In this manner, fine control of oxygen concentration is possible, and a semiconductor single crystal having a low oxygen concentration can be grown with more certainty.

Advantageous Effects of Invention

As described, using the inventive single-crystal pulling apparatus, the concentration of oxygen that is taken into a single crystal can be greatly reduced, and it is possible to achieve a single-crystal pulling apparatus with which growth striations in a single crystal to be grown can be suppressed.

In addition, using the inventive single-crystal pulling apparatus, the height position of the coil center can be raised, the time required for the oxygen from the crucible to reach the single crystal can be prolonged, and dissolution of oxygen from the crucible in a coil axis angle region can be suppressed. Thus, a single-crystal pulling apparatus can be provided that can greatly reduce the concentration of oxygen that is taken into the single crystal, and that can suppress growth striations in the single crystal to be grown.

In addition, according to the inventive single-crystal pulling method, the concentration of oxygen that is taken in is greatly reduced, and a semiconductor single crystal having suppressed growth striations can be grown.

BRIEF DESCRIPTION OF DRAWINGS

FIG. 1 is a schematic view showing an example of the inventive single-crystal pulling apparatus.

FIG. 2A is a perspective view showing an example of a shape of superconducting coils of the present invention.

FIG. 2B is a transverse cross-sectional view showing an example of an arrangement of superconducting coils of the present invention.

FIG. 3 is an analytical diagram showing a magnetic flux density distribution in Example 1.

FIG. 4 is an analytical diagram showing a velocity vector and an oxygen concentration distribution in a melt in Example 1.

FIG. 5 is an analytical diagram showing a velocity vector and an oxygen concentration distribution in a melt in Example 2.

FIG. 6 is an analytical diagram showing a magnetic flux density distribution in Comparative Example 1.

FIG. 7 is an analytical diagram showing a velocity vector and an oxygen concentration distribution in a melt in Comparative Example 1.

FIG. 8 is a schematic view showing an example of a conventional single-crystal pulling apparatus.

FIG. 9 is a schematic view showing an example of a conventional superconducting magnet.

FIG. 10 is an explanatory diagram showing an example of a magnetic field distribution of a conventional superconducting magnet.

FIG. 11A is a perspective view showing an example of a different conventional superconducting magnet.

FIG. 11B is a transverse cross-sectional view showing an example of a different conventional superconducting magnet.

FIG. 12A is a schematic view showing an example of a different conventional single-crystal pulling apparatus.

FIG. 12B is a transverse cross-sectional view showing an example of a different conventional superconducting magnet.

FIG. 13 is a schematic view showing an example of an apparatus for raising and lowering a pulling furnace and an apparatus for raising and lowering a superconducting magnet.

FIG. 14A is a perspective view showing a different example of a shape of the superconducting coils of the present invention.

FIG. 14B is a transverse cross-sectional view showing a different example of an arrangement of superconducting coils of the present invention.

FIG. 15 is an analytical diagram showing a magnetic flux density distribution in Example 3.

FIG. 16 is an analytical diagram showing a velocity vector and an oxygen concentration distribution in a melt in Example 3.

FIG. 17 is an analytical diagram showing a velocity vector and an oxygen concentration distribution in a melt in Example 4.

FIG. 18 is a graph showing a relationship between a magnetic flux density component orthogonal to an inner wall of a crucible (B⊥) and a circumference angle in a case where four coils are arranged.

FIG. 19 is an analytical diagram showing a magnetic flux density distribution in Example 5.

FIG. 20 is an analytical diagram showing a velocity vector and an oxygen concentration distribution in a melt in Example 5.

DESCRIPTION OF EMBODIMENTS

In a case where a conducting fluid moves in a magnetic field, an induced current is produced in a direction orthogonal to lines of magnetic force and a velocity component perpendicular to the lines of magnetic force, but a crucible wall and a free surface of the molten semiconductor raw material become an insulating wall when a quartz crucible having electrically insulating properties is used. Hence, the induced current does not flow in the direction orthogonal to these members. Therefore, convection-suppressing force is also insufficient near a cross section perpendicular to an X axis in a molten semiconductor raw material.

However, when two pairs of superconducting coils are arranged around a pulling furnace to face each other, and when axes running through centers of the pairs of the superconducting coils arranged to face each other are determined as coil axes, the two coil axes in the two pairs of the superconducting coils are included in a single horizontal plane, and a center angle α having an X axis (a direction of lines of magnetic force at the central axis of the pulling furnace in the horizontal plane) sandwiched between the two coil axes is 100 degrees or more and 120 degrees or less, a magnetic field distribution as in Patent Document 2 can be generated. In addition, a flow velocity of the molten semiconductor raw material can be reduced even in the cross section perpendicular to the X axis which has insufficient convection-suppressing force provided by electromagnetic force, and a flow velocity of the molten semiconductor raw material in the cross section parallel to the X axis can be balanced with a flow velocity of the molten semiconductor raw material in the cross section perpendicular to the X axis. Accordingly, as a result, the concentration of oxygen that is taken into the single crystal can be considerably reduced, and growth striations in a growing single crystal can be suppressed as described above.

Furthermore, when saddle-shaped coils are used as the superconducting coils, magnetic field generation efficiency can be enhanced, and the overall height of the coils can be more easily shortened compared with circular coils. Thus, the height position of the centers of the coils can be raised, and the position of the magnetic field center can be a higher position, so that a single crystal having an even lower oxygen concentration can be obtained.

Furthermore, regarding the saddle-shaped coils, the coils are curved by a curvature larger than the curvature of the shape along the outer shape of the pulling furnace, so that the magnetic flux density in a coil axis angle region, where oxygen dissolves from the crucible comparatively readily, is reduced, and the dissolution of oxygen from the crucible in the angle region is suppressed. Thus, a single crystal having an even lower oxygen concentration can be obtained.

The present inventors have found out the above, and completed the present invention.

Hereinafter, embodiments of the present invention will be described with reference to the drawings, but the present invention is not limited thereto.

FIG. 1 shows an example of the inventive single-crystal pulling apparatus.

The single-crystal pulling apparatus 11 in FIG. 1 uses a CZ method, and includes: a pulling furnace 1 which has a heater 3 and a quartz crucible 2 containing a molten semiconductor raw material 6 arranged therein, and which has a central axis 10; and a superconducting magnet (magnetic field generation device 30) which is arranged around the pulling furnace 1 and has superconducting coils. The single-crystal pulling apparatus is configured to apply a horizontal magnetic field to the melt (molten semiconductor raw material, also referred to as a melt) 6 by energization to the superconducting coils to suppress convection of the melt 6 in the crucible 2, while pulling the single crystal 9 in a pulling direction 8.

First Embodiment of Superconducting Coils

Here, the shapes and arrangements of the superconducting coils in the magnetic field generation device 30 will be described in detail with reference to FIGS. 2A and 2B. FIG. 2A is a perspective view showing an example of a shape of the superconducting coils, and FIG. 2B is a transverse cross-sectional view showing an example of an arrangement thereof.

There are a total of four superconducting coils (also simply referred to as coils) 4 (4a to 4d), and each coil has a saddle shape curved along the outer shape of the cylindrical pulling furnace 1. Two pairs arranged to face each other are provided around the pulling furnace 1. Here, 4a and 4c are a pair, and 4b and 4d are a pair.

Since the coils 4 have a saddle shape rather than a conventional circular shape, the perimeter of the coils can be lengthened, and a magnetic field having an even larger magnetic flux density can be generated, so that a high magnetic field generation efficiency can be provided.

Moreover, since the overall height of the coils can be shortened more easily than circular coils, the height position of the coil center can be raised to an even higher position compared with circular coils. That is, the magnetic field center can be set to a higher position relative to the melt 6, and a single crystal 9 having a lower concentration of oxygen can be manufactured.

Note that the coils 4 can have a height that is shorter than the width. In this case, the overall height of the coils can be shortened more certainly, and moreover, a single crystal 9 having a low oxygen concentration can be obtained even more easily.

In addition, when axes running through the centers of the pairs of the coils 4 arranged to face each other are determined as coil axes, the two coil axes 13 and 14 in the two pairs of the coils 4 (the pair of 4a and 4c and the pair of 4b and 4d) are included in the same horizontal plane 12 (see FIG. 1). Furthermore, regarding the lines of magnetic force 7, when the direction of lines of magnetic force at the central axis 10 of the pulling furnace 1 in the horizontal plane 12 is determined as an X axis, the angle having the X axis sandwiched in between (center angle α) out of the angles formed by the two coil axes 13 and 14 is 100 degrees or more and 120 degrees or less.

With the arrangement where the center angle α is 100 degrees or more as described, a magnetic field distribution as in Patent Document 2 can be generated. Thus, the flow velocity in a cross section parallel to the X axis in the melt 6 can be balanced with the flow velocity in a cross section perpendicular to the X axis.

By the realization of this balance, the time required for the oxygen eluted from the inner wall of the crucible 2 to reach the single crystal 9 is prolonged even in a cross section perpendicular to the X axis, and the amount of oxygen evaporated from the free surface of the melt 6 increases. Thus, the concentration of the oxygen taken into the single crystal 9 can be reduced considerably.

In addition, growth striations in the single crystal 9 can be suppressed by the balance.

Furthermore, when the center angle α is 120 degrees or less, adjacent coils 4 can be arranged appropriately without colliding with one another.

Second Embodiment of Superconducting Coils

Here, a different embodiment regarding the shapes and arrangements of the superconducting coils in the magnetic field generation device 30 will be described in detail with reference to FIGS. 14A and 14B. FIG. 14A is a perspective view showing an example of a shape of the superconducting coils, and FIG. 14B is a transverse cross-sectional view showing an example of an arrangement thereof.

There are a total of four superconducting coils (also simply referred to as coils) 4 (4a to 4d), and each coil has a saddle shape curved by a curvature that is larger than the shape along the outer shape of the cylindrical pulling furnace 1. Two pairs arranged to face each other are provided around the pulling furnace 1. Here, 4a and 4c are a pair, and 4b and 4d are a pair.

Since the coils 4 have a saddle shape rather than a conventional circular shape, the perimeter of the coils can be lengthened, and a magnetic field having an even larger magnetic flux density can be generated, so that a high magnetic field generation efficiency can be provided.

Moreover, since the overall height of the coils can be shortened more easily than circular coils, the height position of the coil center can be raised to an even higher position compared with circular coils. That is, the magnetic field center can be set to a higher position relative to the melt 6, and a single crystal 9 having a lower concentration of oxygen can be manufactured.

Note that the coils 4 can have a height that is shorter than the width. In this case, the overall height of the coils can be shortened more certainly, and moreover, a single crystal 9 having a low oxygen concentration can be obtained even more easily.

In addition, when axes running through the centers of the pairs of the coils 4 arranged to face each other are determined as coil axes, the two coil axes 13 and 14 in the two pairs of the coils 4 (the pair of 4a and 4c and the pair of 4b and 4d) are included in the same horizontal plane 12 (see FIG. 1). Furthermore, regarding the lines of magnetic force 7, when the direction of lines of magnetic force at the central axis 10 of the pulling furnace 1 in the horizontal plane 12 is determined as an X axis, the angle having the X axis sandwiched in between (center angle α) out of the angles formed by the two coil axes 13 and 14 is 100 degrees or more and 120 degrees or less.

With the arrangement where the center angle α is 100 degrees or more as described, a magnetic field distribution as in Patent Document 2 can be generated. Thus, the flow velocity in a cross section parallel to the X axis in the melt 6 can be balanced with the flow velocity in a cross section perpendicular to the X axis.

By the realization of this balance, the time required for the oxygen eluted from the inner wall of the crucible 2 to reach the single crystal 9 is prolonged even in a cross section perpendicular to the X axis, and the amount of oxygen evaporated from the free surface of the melt 6 increases. Thus, the concentration of the oxygen taken into the single crystal 9 can be reduced considerably.

In addition, growth striations in the single crystal 9 can be suppressed by the balance.

Furthermore, when the center angle α is 120 degrees or less, adjacent coils 4 can be arranged appropriately without colliding with one another.

Here, the curvature of the coils 4 will be described in detail. The coils 4 are, as described above, curved by a curvature larger than the curvature of the shape along the outer shape of the pulling furnace 1, and the circumstances that lead to the present inventors finding a reason to make such a curve will be explained.

In FIG. 18, the magnetic flux density component (B⊥) orthogonal to the inner wall of the crucible 2 made of quartz has been plotted against the circumference angle. Note that here, the circumference angle is an angle counterclockwise from a reference line (0°) between the coils 4a and 4b as shown in FIG. 14B. In addition, here, a case where four coils 4a to 4d are arranged so that the center angle α is 120 degrees is given as an example. With the shape along the outer shape of the pulling furnace 1 as a reference, when the curvature ratio (the ratio of the curvature of the coils 4 to the curvature of the shape along the outer shape of the pulling furnace 1) is increased from 1.0 to 1.5 and further, to 2.0 therefrom, it can be observed that the B⊥ at around 35° and 145° (that is, the angle region equivalent to the vicinity of the positions of the coil axes 13 and 14 described above, meaning the coil axis angle region) near the central region of each coil is softened.

The magnetic field distribution produced by the arrangement of the coils 4 with a center angle α of 100 degrees or more and 120 degrees or less as in the present invention has a smaller difference in convection-suppressing force of the cross section parallel to the X axis and the cross section perpendicular to the X axis compared with a conventional horizontal magnetic field. Nevertheless, the magnetic flux density component orthogonal to the crucible 2 is particularly strong in the coil axis angle regions, of which there are four over the whole circumference, so that the oxygen diffusion boundary layer of the melt 6 in the vicinity of the inner wall of the crucible 2 is thin. Therefore, oxygen dissolves from the quartz crucible 2 more readily than in other angle regions. Since the magnetic flux density at a distance from the coils 4 is inversely proportional to the square of the distance to the coils 4, the magnetic flux density in these coil axis angle regions can be decreased by increasing the curvature of the coils 4 (making the curvature ratio greater than 1). In this manner, the dissolution of oxygen from the crucible 2 in the coil axis angle regions can be suppressed, and thus, a single crystal 9 having an even lower oxygen concentration can be obtained.

The curvature of these coils 4 is not particularly limited as long as the curvature is larger than the curvature of the shape along the outer shape of the pulling furnace 1. A preferable range of the curvature is 1.2 or more and 2.0 or less when the curvature ratio of the shape along the outer shape of the pulling furnace 1 is set to 1.0 (in FIG. 14B, the line of curvature ratio 1.0 is drawn as a reference). Note that this curvature ratio can be a value in, for example, the center of the thickness of the coils 4. When the curvature ratio is 1.2 or more, the above-described oxygen dissolution can be suppressed more effectively. Meanwhile, when the curvature ratio is 2.0 or less, the outer shape of the casing for storing the coils 4 can be prevented from becoming too large, and degradation in maximum magnetic field strength due to degradation in central magnetic field strength can be suppressed.

The single-crystal pulling apparatus 11 has, as shown in FIG. 1, an apparatus 22 for raising and lowering the pulling furnace 1, and the pulling furnace 1 can be raised and lowered in a vertical direction and rotated.

Furthermore, the single-crystal pulling apparatus 11 has an apparatus 23 for raising and lowering the magnetic field generation device 30, and the magnetic field generation device 30 mounted on the apparatus 23 for raising and lowering can be raised and lowered in a vertical direction (moved vertically). In this manner, the hot zone in the pulling furnace 1 can be dismantled and cleaned easily after the operation has been completed, and it is easy to adjust the oxygen concentration of the single crystal 9 to be grown by adjusting the height of the magnetic field generation device 30.

Next, the inventive single-crystal pulling method using the inventive single-crystal pulling apparatus 11 described above will be described. Here, a method for pulling a silicon single crystal, which is a semiconductor single crystal, will be described.

Firstly, in the single-crystal pulling apparatus 11, a semiconductor raw material (polycrystalline silicon) is put in the crucible 2 and heated by the heater 3 to melt the semiconductor raw material (melt 6).

Next, a horizontal magnetic field generated by the magnetic field generation device 30 is applied to the melt 6 by energization to the superconducting coils 4 to suppress the convection of the melt 6 inside the crucible 2.

Next, a seed crystal (not shown) is moved down and brought into contact with the melt 6 from above, for example, in a central portion of the crucible 2, and the seed crystal is pulled in a pulling direction 8 at a predetermined velocity by a pulling mechanism (not shown) while rotating. In this manner, a crystal grows in a solid and liquid boundary layer, and a semiconductor single crystal (silicon single crystal) 9 is produced.

According to such a single-crystal pulling method, the concentration of oxygen that is taken in is greatly reduced, and a semiconductor single crystal with suppressed growth striations can be grown. The concentration of oxygen in the single crystal to be pulled is not particularly limited. In particular, a single crystal with 5 ppma-JEIDA or less, preferably 3 ppma-JEIDA or less, further preferably 1 ppma-JEIDA or less can be manufactured.

Note that when pulling the semiconductor single crystal, the height position of the magnetic field generation device 30 can be adjusted in accordance with the target value of the concentration of oxygen contained in the semiconductor single crystal by using the apparatus 23 for raising and lowering.

Specifically, the relationship between the height position of the magnetic field generation device 30 and the oxygen concentration in the single crystal 9 is determined in advance by an experiment or the like, and the height position of the magnetic field generation device 30 is set to a desired height position before beginning the pulling. During the pulling of the single crystal 9, the oxygen concentration in the single crystal can be controlled by other parameters without changing the height of the magnetic field. As typical parameters, rotation of the crucible, the position of the heater, etc. can be used.

In addition, while pulling a single single crystal 9, fine control of oxygen concentration is also possible by pattern control of the height position of the magnetic field generation device 30.

EXAMPLE

Hereinafter, the present invention will be more specifically described with reference to Examples of the present invention and Comparative Examples. However, the present invention is not limited thereto.

Example 1

A single crystal was pulled by using the inventive single-crystal pulling apparatus 11 shown in FIGS. 1, 2A, and 2B.

A magnetic field generation device had four superconducting coils arranged (two pairs of coils facing each other) in a single horizontal plane, the superconducting coils being saddle-shaped coils each having a shape that runs along a circle having a radius of 900 mm and the central axis of the pulling furnace being the central line of the circle, the height of the coils being 620 mm, and the width (the length of the outermost circumference along the curve) of the coils being about 985 mm. The coils were arranged with a center angle α having an X axis sandwiched between the two coil axes as 120 degrees when the direction of lines of magnetic force at the central axis was determined as the X axis. Using the magnetic field generation device, magnetic field analysis and 3D melt convection analysis were performed, then a silicon single crystal was pulled by using this device.

In the analysis, calculations were carried out with the calculation conditions: a charge amount of 400 kg; a 32-inch (80 cm) crucible; a silicon single crystal with a diameter of 306 mm; a crystal rotation of 9 rpm; a crucible rotation of 0.4 rpm; and a pulling rate of 0.4 mm/min.

FIG. 3 is a result of magnetic field analysis by ANSYS-Maxwell 3D, and was obtained by adjusting the current× number of turns of the coils so that the magnetic flux density at the central axis was 1000 gauss and performing the analysis, and then displaying the distribution of magnetic flux density.

The magnetic flux density of the space including the crystal and melt regions was extracted from the results of the magnetic field analysis, and 3D melt convection analysis was performed taking magnetic field distribution into consideration. The height position of the coil axes was set to 140 mm below the surface of the melt. The velocity vector inside the melt obtained from the results is shown in the left-hand side of FIG. 4, and the oxygen concentration distribution inside the melt is shown in the right-hand side. ⊥B indicates a cross section perpendicular to the lines of magnetic force, and //B indicates a cross section parallel to the lines of magnetic force.

As in Comparative Example 1 described below, the convection-suppressing force was strong even in the cross section perpendicular to the lines of magnetic force, so that a comparatively active flow was observed only below the end of the crystal, and the oxygen concentration in the melt was also low.

Even with such a shape and arrangement of coils of the present invention, a crystal having an extremely low oxygen concentration of about 3 to 5 ppma-JEIDA on the entire surface and having excellent in-plane distribution can be obtained.

In addition, since the height of the coils is shorter than in Comparative Example 1, there is room for raising the height position of the center of the coil axes for reducing the oxygen concentration further. This will be described below in Example 2.

In addition, in Example 1, the center angle α between the coil axes was set to 120 degrees, but the effects (low oxygen concentration and excellent in-plane distribution) achieved in Example 1 was also achieved when the angle between the coil axes was reduced to 100 degrees.

Example 2

In Example 1, the height of the coils was successfully reduced by 280 mm compared with Comparative Example 1 (overall height of coils: 900 mm) by using saddle-shaped coils. Accordingly, in Example 2, the height position of the coil axes was set to the surface of the melt, and 3D melt convection analysis was performed, then a silicon single crystal was pulled by using this device.

FIG. 5 shows the velocity vector in the melt and the oxygen concentration distribution in the melt obtained by numerical analysis. It can be observed that the oxygen concentration in the melt is lower than in Example 1.

Actually, with this coil arrangements, it was possible to set the height position of the coil axes to the melt surface, and a crystal having an extremely low oxygen concentration of below 1 ppma-JEIDA on the entire wafer surface and also having excellent in-plane distribution was successfully obtained.

Comparative Example 1

A single crystal was pulled by using a single-crystal pulling apparatus having a conventional superconducting magnet (magnetic field generation device) shown in FIGS. 12A and 12B.

A magnetic field generation device had, when the direction of lines of magnetic force in the horizontal plane including the coil axes at the central axis of the pulling machine was determined as an X axis, pairs of coils having a diameter of 900 mm arranged to face each other to provide two pairs of coils so that the coil axes were included in the same horizontal plane. In addition, the coils were arranged in a cylindrical vacuum container with the center angle α between the coil axes sandwiching the X axis as 120 degrees. Using the magnetic field generation device, magnetic field analysis and 3D melt convection analysis were performed, then a silicon single crystal was pulled by using this device.

In the analysis, calculations were carried out with the calculation conditions: a charge amount of 400 kg; a 32-inch (80 cm) crucible; a silicon single crystal with a diameter of 306 mm; a crystal rotation of 9 rpm; a crucible rotation of 0.4 rpm; and a pulling rate of 0.4 mm/min.

FIG. 6 is a result of magnetic field analysis by ANSYS-Maxwell 3D, and was obtained by adjusting the current× number of turns of the coils so that the magnetic flux density at the central axis was 1000 gauss and performing the analysis, and then displaying the distribution of magnetic flux density.

The magnetic flux density of the space including the crystal and melt regions was extracted from the results of the magnetic field analysis, and 3D melt convection analysis was performed taking magnetic field distribution into consideration. The height position of the coil axes was set to 140 mm below the surface of the melt, which was the upper limit position in Comparative Example 1. FIG. 7 shows the velocity vector in the melt, and the oxygen concentration distribution in the melt on the right-hand side obtained from the results.

In the magnetic field of Comparative Example 1, the convection-suppressing force was strong even in the cross section perpendicular to the lines of magnetic force, so that a comparatively active flow was observed only below the end of the crystal, and the oxygen concentration in the melt was also low.

According to this coil arrangement, a crystal having an extremely low oxygen concentration of about 3 to 5 ppma-JEIDA on the entire surface and having excellent in-plane distribution can be obtained. However, in order to enhance magnetic field generation efficiency, the coil diameter needs to be increased, and if a rise in the center height of the coils is attempted to reduce the oxygen concentration further, interference with the pulling machine easily occurs. Therefore, it is difficult to reduce the oxygen concentration further in the apparatus of Comparative Example 1.

Comparative Example 2

Except that the center angle α between the two coil axes was set to 90 degrees, a magnetic field generation device similar to that in Example 1 was used, and magnetic field analysis and 3D melt convection analysis were performed, then a silicon single crystal was pulled by using this device.

However, due to degradation in convection-suppressing force in the cross section perpendicular to the X axis, the oxygen concentration increased, and the in-plane distribution was also degraded. It was not possible to obtain a silicon single crystal having a desired low oxygen concentration and having excellent in-plane distribution.

Comparative Example 3

An attempt was made to assemble a magnetic field generation device similar to that in Example 1 except that the center angle α between the two coil axes was set to 130 degrees. However, adjacent coils collided with each other, so that it was not possible to assemble the device.

Example 3

A single crystal was pulled by using the inventive single-crystal pulling apparatus 11 shown in FIGS. 1, 14A, and 14B.

A magnetic field generation device had four superconducting coils arranged (two pairs of coils facing each other) in a single horizontal plane, the superconducting coils being saddle-shaped coils each being curved by a curvature ratio of 1.8 relative to a shape (a shape along the outer shape of the pulling furnace) that runs along a circle having a radius of 900 mm and the central axis of the pulling furnace being the central line of the circle, the height of the coils being 620 mm, and the width (the length of the outermost circumference along the curve) of the coils being about 980 mm. The coils were arranged with a center angle α having an X axis sandwiched between the two coil axes as 120 degrees when the direction of lines of magnetic force at the central axis was determined as the X axis. Using the magnetic field generation device, magnetic field analysis and 3D melt convection analysis were performed, then a silicon single crystal was pulled by using this device.

In the analysis, calculations were carried out with the calculation conditions: a charge amount of 400 kg; a 32-inch (80 cm) crucible; a silicon single crystal with a diameter of 306 mm; a crystal rotation of 9 rpm; a crucible rotation of 0.4 rpm; and a pulling rate of 0.4 mm/min.

FIG. 15 is a result of magnetic field analysis by ANSYS-Maxwell 3D, and was obtained by adjusting the current× number of turns of the coils so that the magnetic flux density at the central axis was 1000 gauss and performing the analysis, and then displaying the distribution of magnetic flux density.

The magnetic flux density of the space including the crystal and melt regions was extracted from the results of the magnetic field analysis, and 3D melt convection analysis was performed taking magnetic field distribution into consideration. The height position of the coil axes was set to 140 mm below the surface of the melt. The velocity vector in the melt obtained from the results is shown in the left-hand side of FIG. 16, and the oxygen concentration distribution in the melt is shown in the right-hand side. ⊥B indicates a cross section perpendicular to the lines of magnetic force, and //B indicates a cross section parallel to the lines of magnetic force.

As in the above-described Comparative Example 1, the convection-suppressing force is strong even in the cross section perpendicular to the lines of magnetic force, so that a comparatively active flow was observed only below the end of the crystal, and the oxygen concentration in the melt was also low.

Owing to the such a shape and arrangement of coils in the present invention, the coil shape having a large curvature ratio of 1.8 and the magnetic flux density component (B⊥) orthogonal to the inner wall of the crucible being even more uniform in the circumferential direction, it is possible to obtain a crystal having an extremely low oxygen concentration of about 1 to 3 ppma-JEIDA on the entire surface and having excellent in-plane distribution.

In addition, since the height of the coils is shorter than in Comparative Example 1, there is room for raising the height position of the coil axes for reducing the oxygen concentration further. This will be described below in Example 4.

In addition, in Example 3, the center angle α between the coil axes was set to 120 degrees, but the effects (low oxygen concentration and excellent in-plane distribution) achieved in Example 3 was also achieved when the angle between the coil axes was reduced to 100 degrees.

Example 4

In Example 3, the height of the coils was successfully reduced by 280 mm compared with Comparative Example 1 (overall height of coils: 900 mm) by using saddle-shaped coils. Accordingly, in Example 4, the height position of the coil axes was set to the surface of the melt, and 3D melt convection analysis was performed, then a silicon single crystal was pulled by using this device.

FIG. 17 shows the velocity vector in the melt and the oxygen concentration distribution in the melt obtained by numerical analysis. It can be observed that the oxygen concentration in the melt is lower than in Example 3.

Actually, with this coil arrangements, it was possible to set the height position of the coil axes to the melt surface, and a crystal having an extremely low oxygen concentration of below 0.5 ppma-JEIDA on the entire wafer surface and also having excellent in-plane distribution was successfully obtained.

Comparative Example 4

Except that the center angle α between the two coil axes was set to 90 degrees, a magnetic field generation device similar to that in Example 3 was used, and magnetic field analysis and 3D melt convection analysis were performed, then a silicon single crystal was pulled by using this device.

However, due to degradation in convection-suppressing force in the cross section perpendicular to the X axis, the oxygen concentration increased, and the in-plane distribution was also degraded. It was not possible to obtain a silicon single crystal having a desired low oxygen concentration and having excellent in-plane distribution.

Comparative Example 5

An attempt was made to assemble a magnetic field generation device similar to that in Example 3 except that the center angle α between the two coil axes was set to 130 degrees. However, adjacent coils collided with each other, so that it was not possible to assemble the device.

Example 5

Saddle-shaped coils each being curved by a curvature ratio of 1.1, the coils having a height of 620 mm and a width (the length of the outermost circumference along the curve) of about 890 mm were used. Other than that, a magnetic field generation device was used in the same manner as in Example 3, and magnetic field analysis and 3D melt convection analysis were performed, then a silicon single crystal was pulled by using this device.

FIG. 19 is a result of magnetic field analysis by ANSYS-Maxwell 3D, and was obtained by adjusting the current× number of turns of the coils so that the magnetic flux density at the central axis was 1000 gauss and performing the analysis, and then displaying the distribution of magnetic flux density.

The magnetic flux density of the space including the crystal and melt regions was extracted from the results of the magnetic field analysis, and 3D melt convection analysis was performed taking magnetic field distribution into consideration. The height position of the coil axes was set to 140 mm below the surface of the melt as in Example 3 and Comparative Example 1. The velocity vector in the melt obtained from the results is shown in the left-hand side of FIG. 20, and the oxygen concentration distribution in the melt is shown in the right-hand side.

With the magnetic field of Example 5, as in Comparative Example 1, the convection-suppressing force was strong even in the cross section perpendicular to the lines of magnetic force, so that a comparatively active flow was observed only below the end of the crystal, and the oxygen concentration in the melt was also low.

Even with such a shape and arrangement of coils having such a saddle shape and curvature ratio, a crystal having an extremely low oxygen concentration of about 3 to 5 ppma-JEIDA on the entire surface and having excellent in-plane distribution can be obtained. Note that, although the oxygen concentration was about 3 to 5 ppma-JEIDA on the entire surface as described above and was about the same as Comparative Example 1, it was possible to achieve a lower value than in Comparative Example 1 on average.

In addition, since the height of the coils is shorter than in Comparative Example 1, there is room for raising the height position of the coil axes for reducing the oxygen concentration further as in Example 4.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A single-crystal pulling apparatus comprising:
a pulling furnace which has a heater and a crucible containing a molten semiconductor raw material arranged therein, and which has a central axis; and a magnetic field generation device which is arranged around the pulling furnace and has superconducting coils, the single-crystal pulling apparatus applying a horizontal magnetic field to the molten semiconductor raw material by energization to the superconducting coils to suppress convection of the molten semiconductor raw material in the crucible,
wherein the superconducting coils of the magnetic field generation device are saddle-shaped and are curved by a curvature larger than a curvature of a shape along an outer shape of the pulling furnace, two pairs of the saddle-shaped superconducting coils being arranged around the pulling furnace to face each other,
when axes running through centers of the pairs of the superconducting coils arranged to face each other are determined as coil axes,
the two coil axes in the two pairs of the superconducting coils are included in a single horizontal plane, and
when a direction of lines of magnetic force at the central axis of the pulling furnace in the horizontal plane is determined as an X axis, a center angle α having the X axis sandwiched between the two coil axes is 100 degrees or more and 120 degrees or less,
wherein a ratio of the curvature of the saddle-shaped superconducting coils to the curvature of the shape along the outer shape of the pulling furnace is 1.2 or more and 2.0 or less.

2. The single-crystal pulling apparatus according to claim 1, wherein the magnetic field generation device is mounted on an apparatus for raising and lowering that is vertically movable in a vertical direction.

3. The single-crystal pulling apparatus according to claim 1, wherein the saddle-shaped superconducting coils have a height that is shorter than a width of the saddle-shaped superconducting coils.

4. The single-crystal pulling apparatus according to claim 2, wherein the saddle-shaped superconducting coils have a height that is shorter than a width of the saddle-shaped superconducting coils.

5. A single-crystal pulling method comprising pulling a semiconductor single crystal by using the single-crystal pulling apparatus according to claim 1.

6. The single-crystal pulling method according to claim 5, wherein a height position of the magnetic field generation device is adjusted in accordance with a target value of a concentration of oxygen contained in the semiconductor single crystal when pulling the semiconductor single crystal.

* * * * *